(12) United States Patent
Lee

(10) Patent No.: US 12,525,440 B2
(45) Date of Patent: Jan. 13, 2026

(54) CONTAINER AND SUBSTRATE TREATING SYSTEM

(71) Applicant: SEMES CO., LTD., Chungcheongnam-do (KR)

(72) Inventor: Chung Woo Lee, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 903 days.

(21) Appl. No.: 17/825,561

(22) Filed: May 26, 2022

(65) Prior Publication Data

US 2022/0384160 A1    Dec. 1, 2022

(30) Foreign Application Priority Data

May 31, 2021   (KR) .......................... 10-2021-0070015

(51) Int. Cl.
*H01J 37/32*     (2006.01)
*H01L 21/68*     (2006.01)

(52) U.S. Cl.
CPC ........ *H01J 37/32743* (2013.01); *H01L 21/68* (2013.01); *H01J 2237/20285* (2013.01); *H01J 2237/208* (2013.01); *H01J 2237/334* (2013.01)

(58) Field of Classification Search
CPC ....... H01J 37/32743; H01J 2237/20285; H01J 2237/208; H01J 2237/334; H01L 21/68
See application file for complete search history.

(56) References Cited

U.S. PATENT DOCUMENTS

| | | | |
|---|---|---|---|
| 2008/0228430 A1 | 9/2008 | Bonciolini et al. | |
| 2011/0074341 A1* | 3/2011 | Jensen | H02J 50/10 320/108 |
| 2013/0080099 A1* | 3/2013 | Akada | H02J 50/12 307/104 |
| 2020/0373190 A1* | 11/2020 | Lee | H01L 21/68707 |

FOREIGN PATENT DOCUMENTS

| | | |
|---|---|---|
| JP | 2007-536726 A | 12/2007 |
| JP | 2010-283174 A | 12/2010 |
| JP | 2012-079941 A | 4/2012 |
| JP | 2013-506297 A | 2/2013 |
| JP | 2013-163837 A | 8/2013 |
| KR | 10-2006-0135926 A | 12/2006 |
| KR | 10-2012-0034575 A | 4/2012 |
| KR | 10-2019-0011617 A | 2/2019 |

OTHER PUBLICATIONS

Korean Office Action issued in corresponding KR Patent Application No. 10-2021-0070015, dated Nov. 1, 2022, pp. 1-5.
Notice of Reasons for Refusal issued by the Japanese Patent Office on Aug. 1, 2023 in corresponding JP Patent Application No. 2022-087346, with English translation.

* cited by examiner

*Primary Examiner* — Yuechuan Yu
(74) *Attorney, Agent, or Firm* — Carter, DeLuca & Farrell LLP

(57) ABSTRACT

Disclosed is a container that receives a substrate type sensor. The container includes a body having a reception space, one side of which is opened, a door that selectively opens and closes the reception space, a shelf part that supports the substrate type sensor in the reception space, and a charging module that charges the substrate type sensor supported by the shelf part, and the charging module includes a charging part that moves between a standby location and a charging location that charges the substrate type sensor supported by the shelf part.

20 Claims, 26 Drawing Sheets

CONTAINER AND SUBSTRATE TREATING SYSTEM

CROSS-REFERENCE TO RELATED APPLICATIONS

This application claims priority under 35 U.S.C. § 119 to Korean Patent Application No. 10-2021-0070015 filed on May 31, 2021, in the Korean Intellectual Property Office, the disclosures of which are incorporated by reference herein in their entireties.

BACKGROUND

The present disclosure relates to a container and a substrate treating system.

Plasma refers to an ionized gaseous state including ions, radicals, and electrons. The plasma is generated by very high temperature, strong electric fields, or radio frequency (RF) electromagnetic fields. A semiconductor device manufacturing process may include an etching process of removing a thin film formed on a substrate, such as a wafer, by using plasma. The etching process is performed as ions and/or radicals of plasma collide with a thin film on a substrate or react with a thin film.

An apparatus for treating a substrate by using plasma includes a process chamber, a support chuck (for example, an ESC) that supports a substrate in the process chamber and is connected to an RF power source, and a focus ring that surrounds an outer periphery of the substrate seated on the support chuck. The focus ring is installed to distribute plasma with a high uniformity, and is etched together with the substrate with plasma. When the substrate is repeatedly etched, the focus ring also is etched so that the shape of the focus ring gradually changes. A direction, in which ions and/or radicals are input to the substrate, is changed according to a change in the shape of the focus ring and thus the etching characteristics of the substrate are changed. Accordingly, when a specific number or more of substrates are etched or the shape of the focus ring is changed to deviate from an allowable range, it is necessary to replace the focus ring.

In general, the focus ring is exchanged by opening the process chamber, extracting the focus ring used from the opened process chamber, mounting an unused focus ring in the process chamber, by an operator. However, in the exchange scheme, much work time is consumed, and a possibility of particles being introduced into the process chamber is high. Accordingly, in recent years, an exchange scheme, in which the transfer robot of the substrate treating apparatus carries out the used focus ring from the process chamber and carries the ring pod in, and then the transfer robot carries out a new focus ring from the ring pod and carries the focus ring into the process chamber, has been used.

Meanwhile, the focus ring is transferred by the transfer robot that transfers the substrate. The transfer robot transfers the focus ring to a specific location in the process chamber. Furthermore, to identify whether the focus ring is transferred to the specific location, the focus ring is photographed through a vision wafer having a similar shape to that of the substrate. The vision wafer is driven while consuming electric power. A power source device, such as a battery, is installed in the vision wafer, and it is necessary to charge the power source device in the vision wafer.

In general, an apparatus for charging a vision wafer is not provided in a container, such as an FOUP, which receives the vision wafer. Accordingly, to charge the vision wafer, a charging part that charges the vision wafer is separately provided. When the vision wafer is located in the charging part, the charging part charges the vision wafer. However, the charging part of the vision wafer is provided separately from a substrate treating apparatus, several transfer sequences have to be performed to transfer to the vision wafer into the process chamber. Furthermore, when a charging device for charging the vision wafer is installed in a container, such as an FOUP, the charging device may collide with a transfer hand of a transfer robot, which enters the container.

SUMMARY

Embodiments of the inventive concept provide a container that may effectively charge a substrate type sensor, and a substrate treating system.

Embodiments of the inventive concept also provide a container that may minimize collision of a charging module installed in the container and a hand of a transfer robot when the hand of the transfer robot enters the container, and a substrate treating system.

The aspect of the present disclosure is not limited thereto, and other unmentioned aspects of the present disclosure may be clearly appreciated by those skilled in the art from the following descriptions.

The present disclosure provides a container that receives a substrate type sensor. The container includes a body having a reception space, one side of which is opened, a door that selectively opens and closes the reception space, a shelf part that supports the substrate type sensor in the reception space, and a charging module that charges the substrate type sensor supported by the shelf part, and the charging module includes a charging part that moves between a standby location and a charging location that charges the substrate type sensor supported by the shelf part.

According to an embodiment, the charging module may include a guide part that guides movement of the charging part in one direction that is parallel to one surface of the substrate type sensor supported by the shelf part, a support part that supports the charging part while moving along the guide part, and a driving part that moves the support part in the one direction.

According to an embodiment, the driving part may include a driving source that generates a driving force, and an arm coupled to the charging part and that moves the charging part in the one direction by using the driving force.

According to an embodiment, the charging part may move in an area on a lower side of the substrate type sensor supported by the shelf part.

According to an embodiment, a plurality of shelf parts and a plurality of charging modules may be provided, and the charging modules may charge substrate type sensors supported by the shelf parts, respectively.

According to an embodiment, the container may further include a first location sensor that detects whether the substrate type sensor is seated on the shelf part, a second location sensor that detects a location of the charging part, and an opening/closing sensor that detects whether the reception space is opened or closed.

According to an embodiment, the charging part may move to the charging location when the first location sensor detects that the substrate type sensor is seated on the shelf part and the opening/closing sensor detects the reception space is closed by the door.

According to an embodiment, the charging part may start to charge the substrate type sensor when the second location sensor detects that the charging part has completely moved to the charging location.

According to an embodiment, the charging part may move to the standby location when it is detected that the substrate type sensor has been completely charged or when the opening/closing sensor detects that the reception space is opened.

The present disclosure provides a substrate treating system. The substrate treating system include an index part having a load port, a process executing part that receives a substrate from the index part and treat the substrate, and a container positioned in the load port, and that receives a substrate type sensor carried into the process executing part, the container further includes a body having a reception space, one side of which is opened, a door that selectively opens and closes the reception space, a shelf part that supports the substrate type sensor in the reception space, and a charging module that charges the substrate type sensor supported by the shelf part, and the charging module includes a charging part that moves between a first location and a second location that is closer to the one side than the first location.

According to an embodiment, the container may include a first location sensor that detects whether the substrate type sensor is seated on the shelf part, a second location sensor that detects a location of the charging part, and an opening/closing sensor that detects whether the reception space is opened or closed.

According to an embodiment, the substrate treating system may further include a controller, and the controller may control the charging module based on a detection value detected by the first location sensor, the second location sensor, or the opening/closing sensor.

According to an embodiment, the controller may control the charging module such that the charging module is in a charging mode for charging the substrate type sensor supported by the shelf part or in a standby mode, in which the charging part is located at the second location, based on the detection value.

According to an embodiment, the controller may control the charging module such that the charging module is in the charging mode when the first location sensor detects that the substrate type sensor is seated on the shelf part and the opening/closing sensor detects that the reception space is closed by the door.

According to an embodiment, the controller may control the charging module such that the charging module is in the standby mode when the substrate type sensor has been completely charged, when the first location sensor detects that the substrate is not positioned on the shelf part, or when the opening/closing sensor detects that the reception space is opened.

According to an embodiment, the charging module may further include a guide part that guides movement of the charging part in one direction that is parallel to one surface of the substrate type sensor supported by the shelf part, a support part that supports the charging part while moving along the guide part, and a driving part that moves the support part in the one direction.

According to an embodiment, the driving part may include a driving source that generates a driving force, and an arm coupled to the charging part and that moves the charging part in the one direction by using the driving force.

The present disclosure provides a substrate treating system. The substrate treating system includes an index part having a transfer robot and a load port, a process executing part that receives a substrate from the index part and treat the substrate, and a container positioned in the load port, and that receives a substrate type sensor carried into the process executing part, the container includes a body having a reception space, one side of which is opened, a door that selectively opens and closes the reception space, a shelf part that supports the substrate type sensor in the reception space, and a charging module that charges the substrate type sensor supported by the shelf part in a wireless charging scheme, and the charging module includes a charging part that moves between a standby location and a charging location that is closer to the one side than the standby location, and that moves in an area on a lower side of the substrate type sensor supported by the shelf part, a first location sensor that detects whether the substrate type sensor is seated on the shelf part, a second location sensor that detects a location of the charging part, and an opening/closing sensor that detects whether the reception space is opened or closed.

According to an embodiment, the driving part may include a driving source that generates a driving force, and an arm coupled to the charging part and that moves the charging part in the one direction by using the driving force.

According to an embodiment, the substrate treating system may further include a controller, and the controller may generate a control signal for moving the charging part to the charging location when the first location sensor detects that the substrate type sensor is seated on the shelf part and the opening/closing sensor detects the reception space is closed by the door, may generate a control signal for causing the charging part to start to charge the substrate type sensor when the second location sensor detects that the charging part has completely moved to the charging location, may generate a control signal for moving the charging part to the standby location when it is detected that the substrate type sensor has been completely charged or when the opening/closing sensor detects that the reception space is opened.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
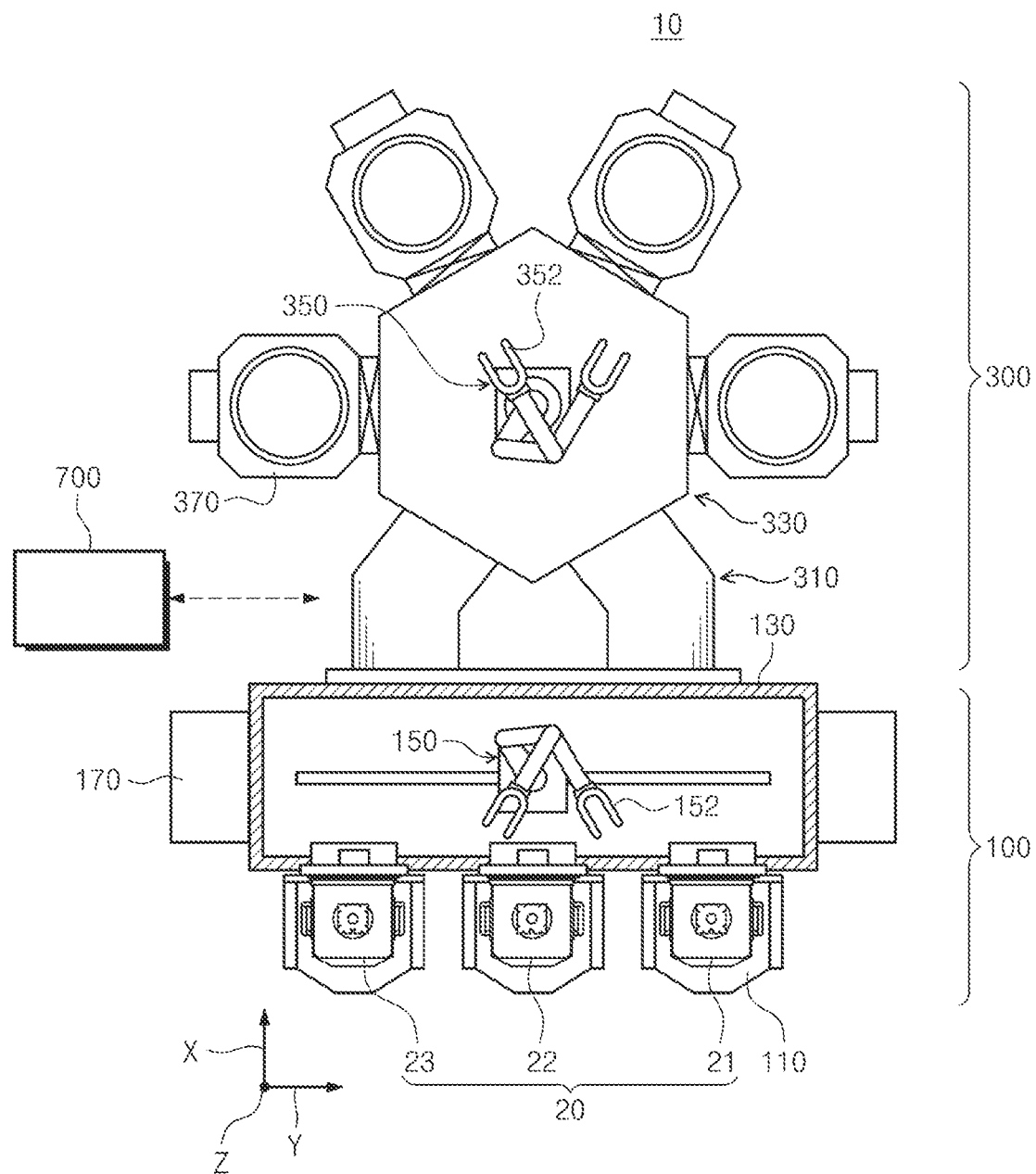
FIG. 1 is a plan view schematically illustrating a substrate treating system according to an embodiment of the present disclosure.

Hereinafter, embodiments of the present disclosure will be described in detail with reference to the accompanying drawings so that those skilled in the art, to which the present disclosure pertains, may easily carry out the present disclosure. However, the present disclosure may be implemented in various different forms, and is not limited to the embodiments, which will be described below. Furthermore, in a detailed description of preferred embodiments of the present disclosure, a detailed description of related known functions or configurations may be omitted when it may make the essence of the present disclosure unnecessarily unclear. In addition, the same reference numerals are used for parts that perform similar functions and operations throughout the drawings.

The expression of 'including' some elements may mean that another element may be further included without being excluded unless there is a particularly contradictory description. In detail, the terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

The terms of a singular form may include plural forms unless otherwise specified. Furthermore, in the drawings, the shapes and sizes of the elements may be exaggerated for clearer description.

The terms such as first and second may be used to describe various elements, but the elements are not limited to the terms. The terms may be used only for the purpose of distinguishing one element from another element. For example, while not deviating from the scope of the present disclosure, a first element may be named a second element, and similarly, the second element may be named as the first element.

When it is mentioned that one element is "connected to" or "electrically connected to" another element, it should be understood that the first element may be directly connected or electrically connected to the second element but a third element may be provided therebetweeen. On the other hand, when it is mentioned that an element is "directly connected to" or "directly electrically connected to" another element, it should be understood that a third element is not present between them. It should be construed that other expressions that describe the relationships between elements, such as "between", "directly between", "adjacent to", and "directly adjacent to" may have the same purpose.

In addition, unless defined otherwise, all terms used herein, including technical or scientific terms, have the same meanings as those generally understood by those skilled in the art to which the present disclosure pertains. The terms defined in the generally used dictionaries should be construed as having the meanings that coincide with the meanings of the contexts of the related technologies, and should not be construed as ideal or excessively formal meanings unless clearly defined in the specification of the present disclosure.

Hereinafter, embodiments of the present disclosure will be described in detail with reference to FIGS. 1 to 25.

FIG. 1 is a view schematically illustrating a substrate treating system according to an embodiment of the present disclosure. Referring to FIG. 1, the substrate treating system according to an embodiment of the present disclosure may include a substrate treating apparatus 10, a container 20, and a ring carrier 30.

The container 20 according to an embodiment of the present disclosure may be positioned on a load port 110 of the substrate treating apparatus 10. The container 20 may be positioned on the load port 110 of the substrate treating apparatus 10 by an overhead transport (OHT) apparatus. Various articles may be received in the container 20. The container 20 may include various kinds of containers according to kinds of the received articles. The container 20 may be called as an FOUP or a POD.

Figure 2:
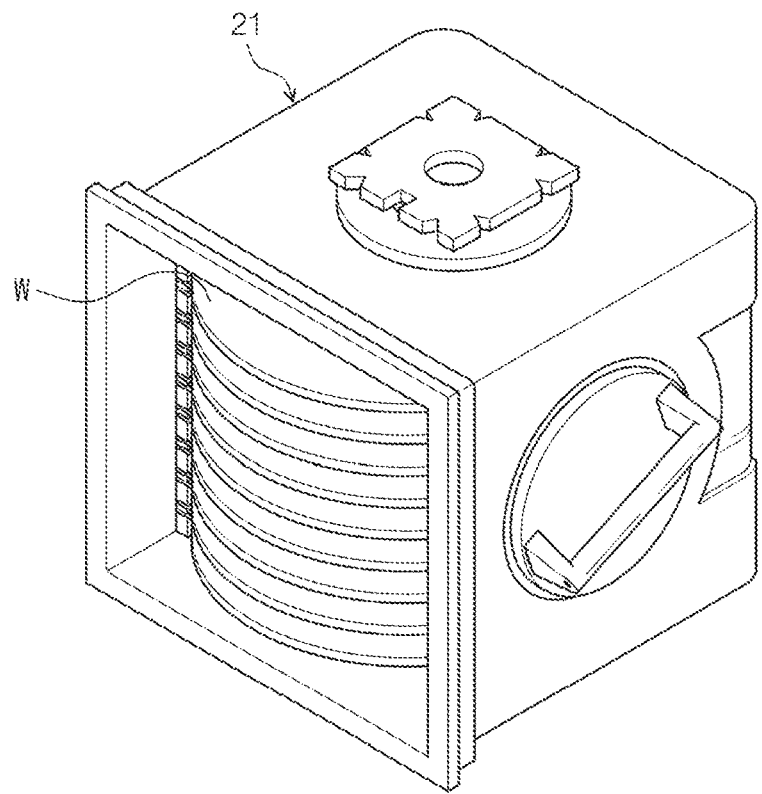
FIG. 2 is a perspective view illustrating an appearance of a first container of FIG. 1.
Figure 3:
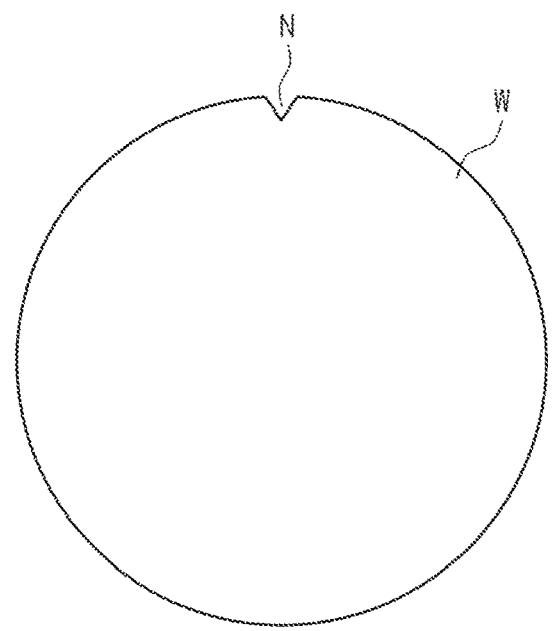
FIG. 3 is a view illustrating an appearance of a substrate received in a first container of FIG. 2.

For example, as illustrated in FIG. 2, an object that is to be treated by the substrate treating apparatus 10 may be received in a first container 21 that is any one of the containers 20. The treated object may be a substrate "W" such as a wafer illustrated in FIG. 3. Furthermore, a notch "N" may be formed in the substrate "W". To properly treat the substrate "W" with the substrate treating apparatus 10, it is necessary to accurately transfer the substrate "W" to a desired location of the substrate treating apparatus 10. The notch "N" formed in the substrate "W" is used to align the substrate "W" for accurate transfer thereof. The alignment of the substrate "W" may be made through an alignment unit 200 as will be described later.

Figure 4:
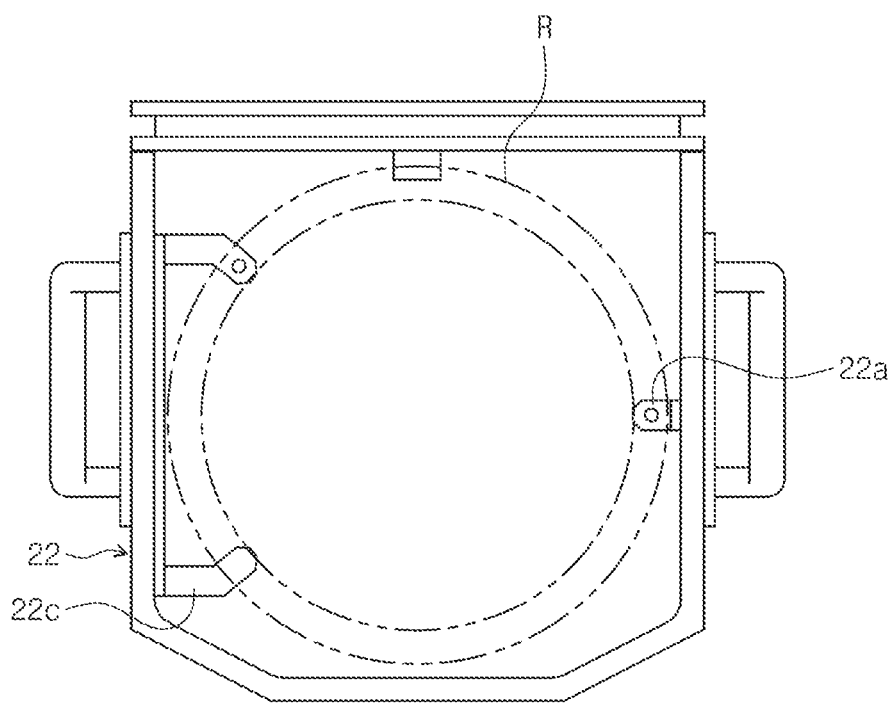
FIG. 4 is a plan cross-sectional view illustrating an appearance of a second container of FIG. 1.

Furthermore, as illustrated in FIG. 4, an expendable component that is mounted on the substrate treating apparatus 10 and is exchangeable may be received in a second container 22 that is another one of the containers 20. The expendable component may be a ring member "R", such as a focus ring or a dielectric ring. A diameter of an outer periphery of the ring member "R" may be larger than a diameter of an outer periphery of the substrate "W". Accordingly, a volume of a space in the second container 22 may be rather larger than that of a space in the first container 21. Furthermore, a plurality of support slots 22a and 22c for supporting the ring member "R" in the second container 22 may be provided at different locations when viewed from a top. Furthermore, the support slots 22a and 22c may be disposed at locations corresponding to openings 32 formed in the ring carrier 30, which will be described below. This is because the ring carrier 30 may be prevented from interfering with the support slots 22a and 22c when the ring member "R" is carried out from the second container 22 by using the ring carrier 30.

Figure 5:
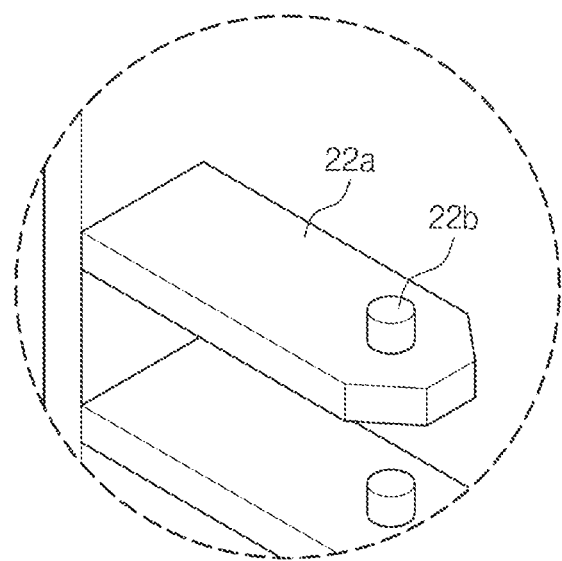
FIG. 5 is a view illustrating an appearance of a support slot of FIG. 4.
Figure 6:
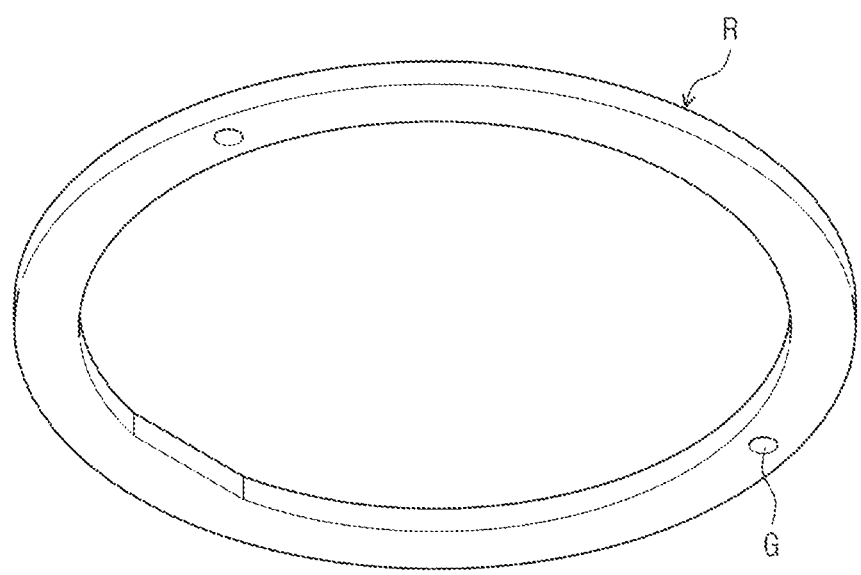
FIG. 6 is a view illustrating an appearance of a ring member received in a second container of FIG. 4.

Furthermore, an alignment pin 22b, as illustrated in FIG. 5, may be formed in, among the support slots 22a and 22c, one or more (for example, a plurality of) support slots 22a. The alignment pin 22b may be inserted into an alignment recess "G" formed on a lower surface of the ring member "R" illustrated in FIG. 6. It is important to transfer the ring member "R" at an accurate location to properly mount the ring member "R" to a desired location of the substrate treating apparatus 10. It is important to position the ring member "R" at the same location of a first transfer hand 152, which will be described below, to transfer the ring member "R" to an accurate location. The alignment pin 22b may allow the ring member "R" to be positioned at the same location of the first transfer hand 152 by restricting change of a lateral location of the ring member "R".

Furthermore, an operator may receive the ring member "R" at an accurate location in the second container 22 simply by inserting the alignment pin 22b into the alignment recess "G" formed on the lower surface of the ring member "R". A location, at which the ring member "R" is received in the second container 22, may be changed according to skillfulness of the operator, but the alignment pin 22b may minimize the problem. Furthermore, a direction of the ring member "R" aligned by the alignment pin 22b may be aligned in the same direction. For example, a flat zone of the ring member "R" aligned by the alignment pin 22b may be aligned in the same direction. For example, because the ring member "R" is aligned in the same direction by the alignment pin 22b, it is not separately necessary to align the direction of the ring member "R" for positioning the ring member "R" on the ring carrier 30.

The ring carrier 30 according to an embodiment of the present disclosure may be used to transfer the ring member "R". For example, the ring carrier 30 may be used to transfer the ring member "R" between an index chamber 130, an alignment chamber 170, and a load lock chamber 310, which will be described below. The ring carrier 30 may be received in the above-described container 20. For example, the ring carrier 30 may be received in the above-described second container 22. The ring carrier 30 may be received below the ring member "R" that is received in the second container 22. The ring carrier 30 received in the second container 22 may be received in the second container 22 while a direction thereof is aligned. The ring carrier 30 may be used to cause a first transfer robot 150, which will be described below, to transfer the ring member "R"

Figure 7:
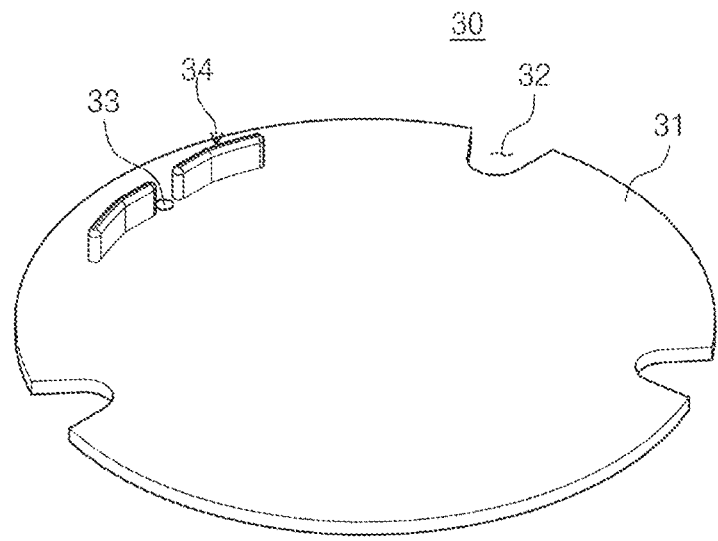
FIG. 7 is a perspective view illustrating an example of a ring carrier used to transfer a ring member.
Figure 8:
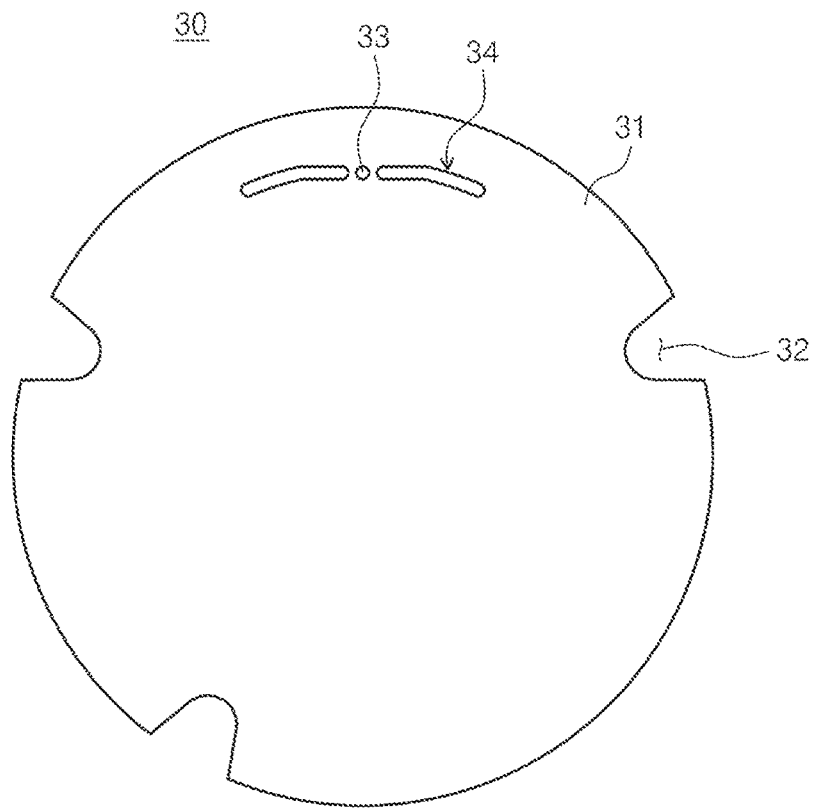
FIG. 8 is a plan view of a ring carrier of FIG. 7.
Figure 9:
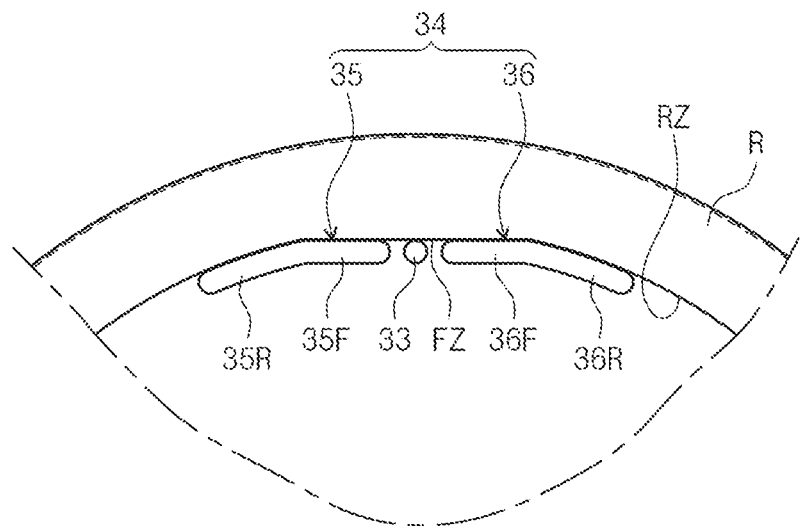
FIG. 9 is an enlarged view illustrating a portion of a ring carrier of FIG. 8.

FIG. 7 is a perspective view illustrating an example of the ring carrier used to transfer the ring member. FIG. 8 is a plan view of the ring carrier of FIG. 7. FIG. 9 is an enlarged view illustrating a portion of the ring carrier of FIG. 8. Referring to FIGS. 7 to 9, the ring carrier 30 according to an embodiment of the present disclosure may include a body 31 and a guide part 34.

The body 31 may have a seating surface, on which the ring member "R" is positioned. The ring member "R" may be positioned on an upper surface of the body 31. The body 31 may have a plate shape. The body 31 may have a disk shape. The body 31 has the disk shape to make an operation of aligning a direction of the ring carrier 30 by the alignment unit 200 the same as or at least similar to an operation of aligning a direction of the substrate "W".

A central area of the body 31 may be provided with a blocking plate having no hole. Furthermore, one or more openings 32 may be formed in a peripheral area of the body 31. A plurality of openings 32 may be formed in the peripheral area of the body 31. The openings 32 may extend from the upper surface to the lower surface of the body 31. That is, the openings 32 may pass through the body 31. The openings 32 may be formed in the peripheral area of the body 31, and may be formed in the peripheral area of the body 31 including the outer periphery of the body 31. That is, the openings 32 may extend to the outer periphery of the body 31. Furthermore, when the openings 32 are viewed from a top, they may be formed at locations that overlap support shelves 320 provided in the load lock chamber 310. Furthermore, when the openings 32 are viewed from a top, they may be formed at locations that overlap the support slots 22a and 22c of the second container 22. This is because the ring carrier 30 may be prevented from overlapping the support shelves 320 or the support slots 22a and 22c when the ring member "R" is transferred by using the ring carrier 30.

An alignment hole 33 may be formed in the body 31. When viewed from a top, the alignment hole 33 may be formed between a first guide part 35 and a second guide part 36. The alignment hole 33 may be a hole that is used when the alignment unit 200, which will be described below, aligns the ring carrier 30. The alignment hole 33 may extend from the upper surface to the lower surface of the body 31. That is, the alignment hole 33 may pass through the body 31. Furthermore, the alignment hole 33 may be formed at a location that overlaps the notch "N" formed in the substrate "W". For example, a distance from a center of the body 31 to a center of the alignment hole 33 may be the same as a distance from a center of the substrate "W" to a center of the notch "N". This is for the purpose of making an operation of aligning a direction of the ring carrier 30 by the alignment unit 200 the same as or at least similar to an operation of aligning a direction of the substrate "W".

When the ring member "R" is positioned on the ring carrier 30 and the ring carrier 30 is transferred by the first transfer hand 152, the ring member "R" may be slid through linear movement of the first transfer hand 152 or a seating location of the ring member "R" may be distorted through rotation of the first transfer hand 152. The guide part 34 may prevent sliding or distortion of the ring member "R". The guide part 34 also may be referred to as a guide boss.

The guide part 34 may protrude from the upper surface of the body 31. The guide part 34 may protrude upwards from the upper surface of the body 31. An inner periphery of the ring member "R" positioned on the ring carrier 30 may have a flat zone FZ and a round zone RZ, and the guide part 34 may be formed at a location that faces an inner periphery of the flat zone FZ of the ring member "R". The guide part 34 may have a shape corresponding to the inner periphery of the ring member "R". The guide part 34 may have a shape corresponding to the inner periphery of the ring member "R" including the flat zone FZ.

The guide part 34 may include the first guide part 35 (the first guide boss) and the second guide part 36 (a second guide boss). The first guide part 35 and the second guide part 36 may have symmetrical shapes. For example, the first guide part 35 and the second guide part 36 may have shapes that are symmetrical to each other with respect to the alignment hole 33 formed therebetween.

The first guide part 35 may include a first flat portion 35F and a first round portion 35R. The second guide part 36 may include a second flat portion 36F and a second round portion 36R. The first flat portion 35F may have a shape corresponding to the inner periphery of the flat zone FZ. The first round portion 35Z may be bent and extend from the first flat portion 35F, and may have a shape corresponding to the inner periphery of the round zone RZ of the ring member "R". The first flat portion 35F and the first round portion 35Z have shapes that are symmetrical to the second flat portion 36F and the second round portion 36Z, and a repeated description thereof will be omitted.

The guide part 34 helps the flat zone FZ of the ring member "R" to be aligned in a specific direction on the ring carrier 30. Furthermore, the alignment hole 33 is formed between the first guide part 35 and the second guide part 36. Accordingly, when the ring carrier 30 is aligned by using the alignment unit 200, which will be described below, a direction of the flat zone FZ of the ring member "R" positioned on the ring carrier 30 also may be aligned in a desired direction. Furthermore, outer peripheries of the first round portion 35Z and the second round portion 36Z, and the inner periphery of the round zone RZ may have the same radii of curvature. Furthermore, the outer peripheries of the first round portion 35Z and the second round portion 36Z, and the outer periphery of the substrate "W" may have the same radii of curvature.

Referring to FIG. 1 again, the substrate treating apparatus 10 according to an embodiment of the present disclosure may include an index part 100, a process executing part 300, and a controller 700. The index part 100 and the process executing part 300 may be arranged along a first direction "X" when viewed from a top. Hereinafter, a direction that is perpendicular to the first direction "X" when viewed from the top is defined as a second direction "Y". Furthermore, a direction that is perpendicular to the first direction "X" and the second direction "Y" is defined as a third direction "Z". Here, the third direction "Z" may refer to a direction that is perpendicular to a ground surface.

The index part 100 may include the load port 110, the index chamber 130, the first transfer robot 150, and the alignment chamber 170.

The container 20 may be seated in the load port 110. As described above, the container 20 may be transferred to the load port 110 by the OHT apparatus to be loaded in the load port 110 or unloaded from the load port 110, and may be transferred. However, the present disclosure is not limited, and the container 20 may be transferred by various devices for transferring the container 20. Furthermore, an operator may directly load the container 20 in the load port 110 or unload the container 20 seated in the load port 110 from the load port 110.

The index chamber 130 may be provided between the load port 110 and the process executing part 300. That is, the load port 110 may be connected to the index chamber 130. An interior of the index chamber 130 may be maintained in an atmospheric pressure atmosphere.

Figure 10:
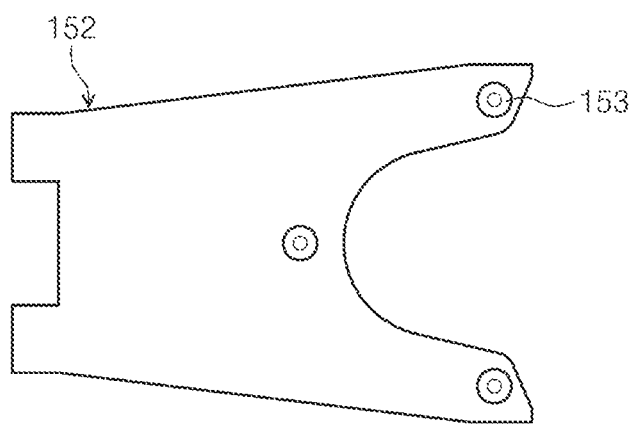
FIG. 10 is a view schematically illustrating an appearance of a first transfer hand of FIG. 1.
Figure 11:
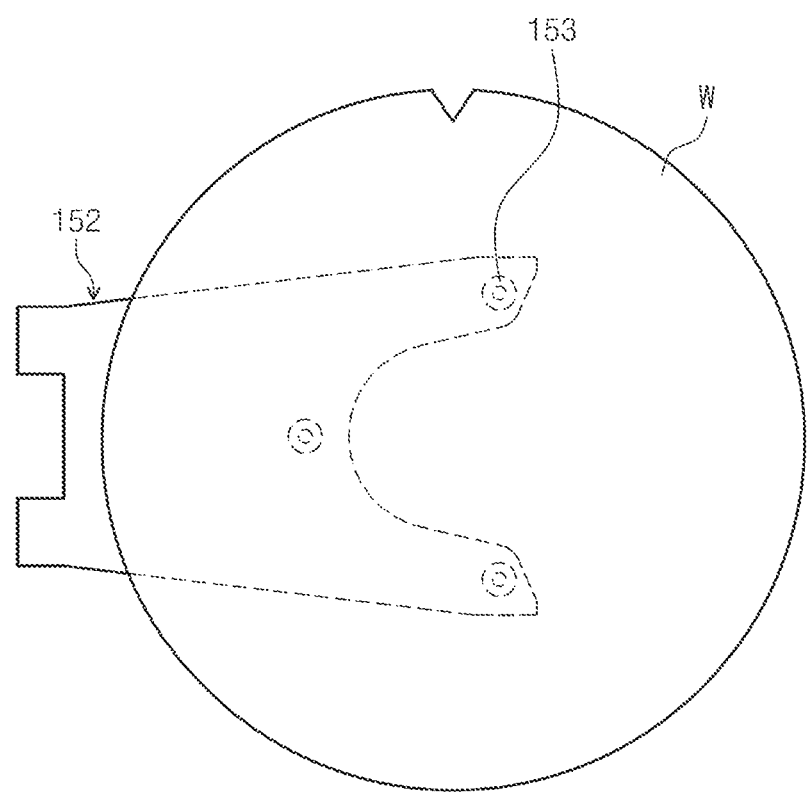
FIG. 11 is a view illustrating an appearance, in which a substrate is positioned on a first transfer hand of FIG. 10.
Figure 12:
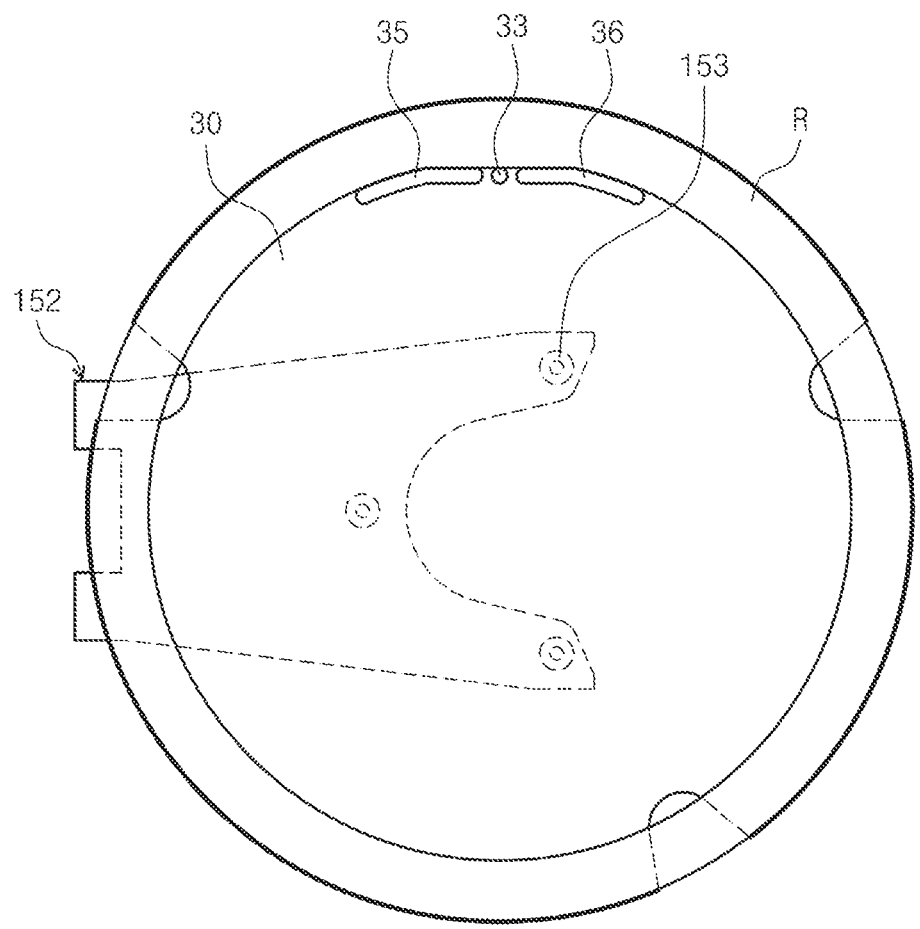
FIG. 12 is a view illustrating an appearance, in which a ring member and a ring carrier are positioned on a first transfer hand of FIG. 10.

Furthermore, the first transfer robot 150 may be provided in the index chamber 130. The first transfer robot 150 may transfer the substrate "W" and the ring member "R" between the container 20 seated in the load port 110, the load lock chamber 310, which will be described below, and the alignment chamber 170. Furthermore, the first transfer robot 150 may have the first transfer hand 152. A plurality of first support pads 153, as illustrated in FIG. 10, may be provided on an upper surface of the first transfer hand 152. For example, three first support pads 153 may be provided, and may support a transfer target object positioned on the first transfer hand 152 at three points. The first support pad 153 may prevent sliding of the substrate "W" or the ring carrier 30 positioned on the first transfer hand 152. When viewed from a top, the first support pads 153 may be arranged along a circumferential direction of an imaginary circle having one radius. Furthermore, the first transfer hand 152 may have a size, by which it may be easily enter the above-described container 20. Furthermore, as illustrated in FIG. 11, the substrate "W" may be positioned on the first transfer hand 152, and as illustrated in FIG. 12, the ring carrier 30 that supports the ring member "R" may be positioned.

Figure 13:
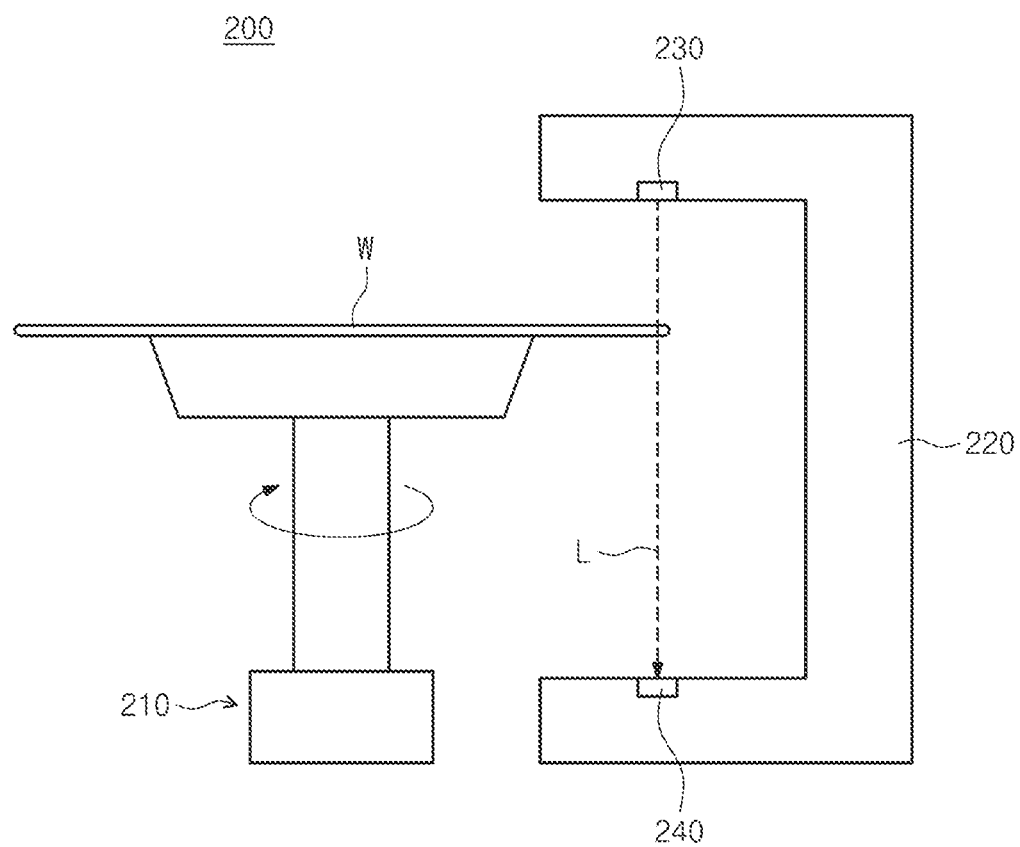
FIG. 13 is a view illustrating an appearance of an alignment unit provided in an alignment chamber of FIG. 1.

The alignment chamber 170 provided with the alignment unit 200, which will be described below, may be installed on one side and/or an opposite side of the index chamber 130. The substrate "W" or the ring carrier 30 may be aligned in the alignment chamber 170. FIG. 13 is a view illustrating an appearance of an alignment unit provided in an alignment chamber of FIG. 1. Referring to FIG. 13, the alignment unit 200 provided in the alignment chamber 170 may align the substrate "W". For example, the alignment unit 200 may align a direction of the notch "N" formed in the substrate "W". Furthermore, the alignment unit 200 may align a direction of the alignment hole 33 formed in the ring carrier 30.

The alignment unit 200 may include a chuck 210, a support mechanism 220, an irradiation part 230, and a light receiving part 240. The chuck 210 may support a central area of the substrate "W". The chuck 210 may support the substrate "W" in a vacuum absorption scheme. Unlike this, a pad that prevents sliding of a target support object may be provided on an upper surface of the chuck 210. The chuck 210 may rotate the substrate "W".

The support mechanism 220 may support the irradiation part 230 and the light receiving part 240. The irradiation part 230 may irradiate light "L" in a direction from an upper side to a lower side of the substrate "W" supported by the chuck 210. The light "L" may be a laser beam having a specific width. The light receiving part 240 may be disposed to face the irradiation part 230. For example, the light receiving part 240 may be disposed on an irradiation path of the light "L" irradiated by the irradiation part 230. The chuck 210 may rotate the substrate "W" until the light "L" irradiated by the irradiation part 230 reaches the light receiving part 240 through the notch "N" formed in the substrate "W". When the light receiving part 240 receives the light "L", the chuck 210 stops rotation of the substrate "W" and may finish alignment of the substrate "W".

Figure 14:
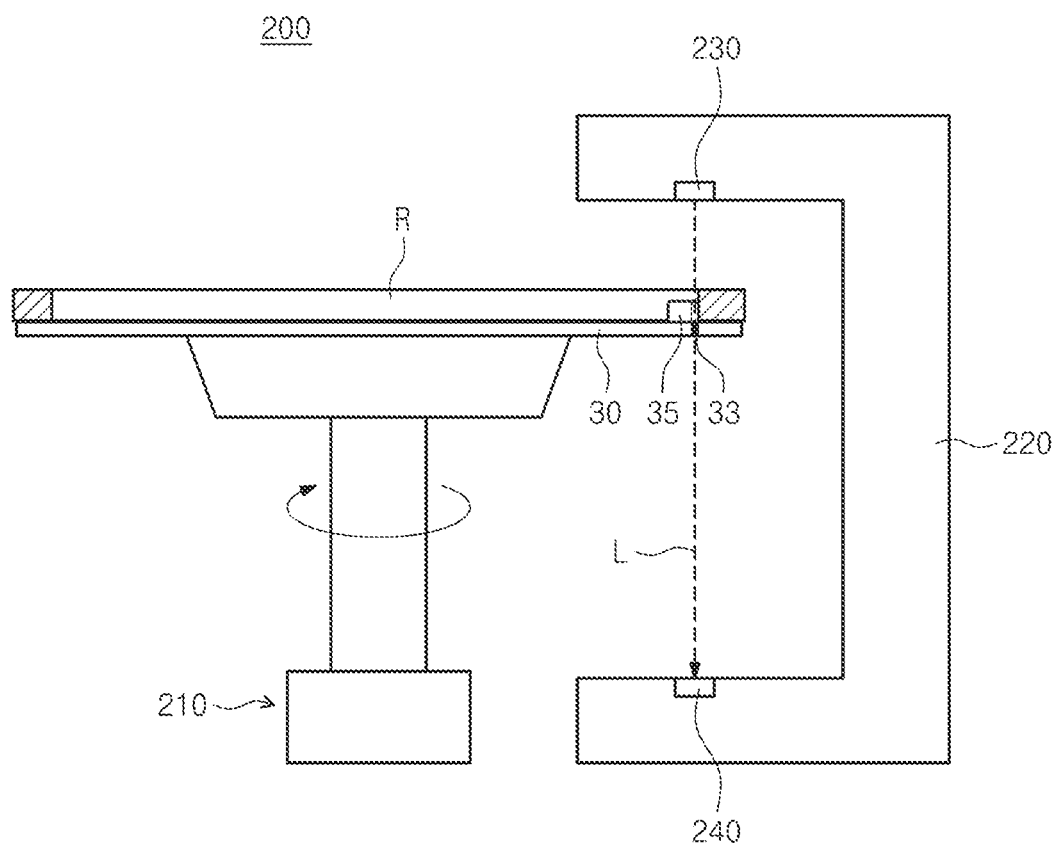
FIGS. 14 and 15 are views illustrating an appearance, in which an alignment unit of FIG. 13 aligns a ring carrier.

As illustrated in FIG. 14, the alignment unit 200 may align the ring carrier 30, similarly to the above-described scheme of aligning the substrate "W". As described above, the alignment hole 33 is formed in the ring carrier 30. When the ring carrier 30 is positioned on the chuck 210, the chuck 210 may rotate the ring carrier 30 until the light "L" irradiated by the irradiation part 230 reaches the light receiving part 240 through the alignment hole 33 formed in the ring carrier 30. When the light receiving part 240 receives the light "L", the chuck 210 stops rotation of the ring carrier 30 and may finish alignment of the ring carrier 30. As described above, because the location, at which the alignment hole 33 is formed, may overlap the location, at which the notch "N" is formed, the ring carrier 30 and the substrate "W" may be aligned by using the same alignment unit 200.

Figure 15:
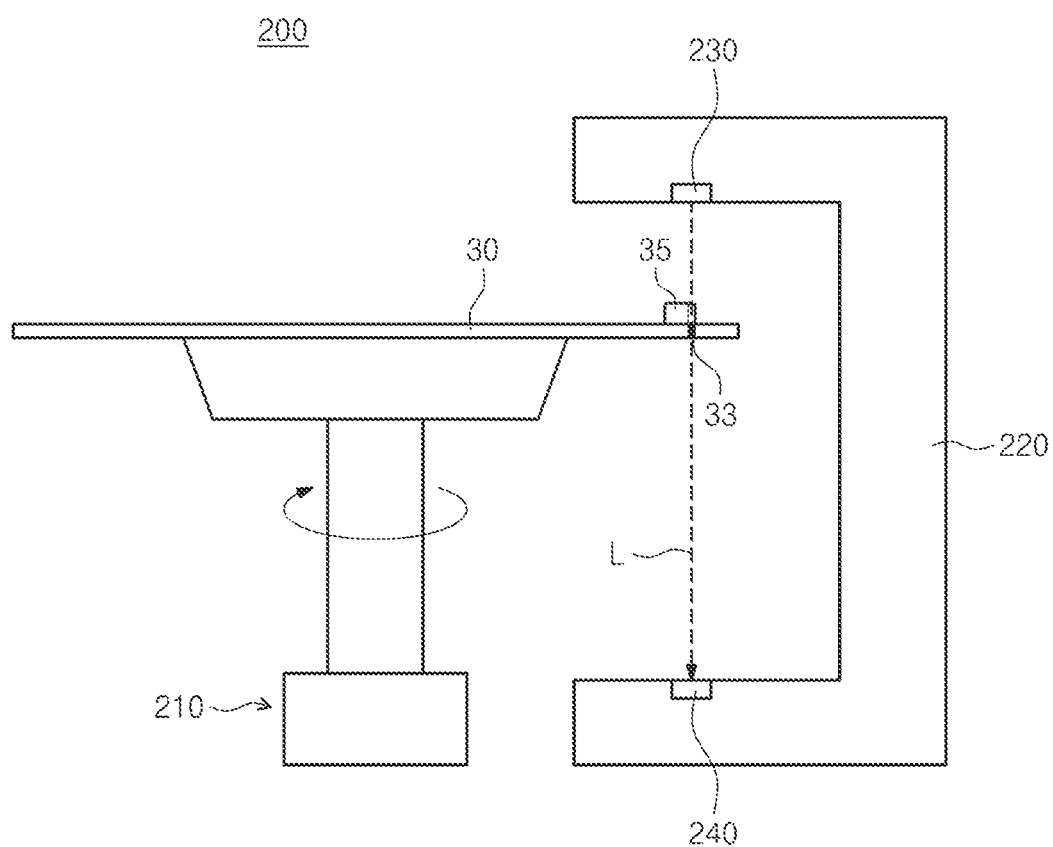

FIG. 14 illustrates as an example, that the ring carrier 30 is aligned in a state, in which the ring member "R" is positioned on the ring carrier 30, but the present disclosure is not limited thereto. If necessary, the ring carrier 30 may be aligned in a state, in which the ring member "R" is not poisoned on the ring carrier 30 as illustrated in FIG. 15.

Referring to FIG. 1 again, the process executing part 300 may include the load lock chamber 310, a transfer chamber 330, a second transfer robot 350, and a process chamber 370.

The load lock chamber 310 may be disposed between the index chamber 130 and the transfer chamber 330. As described above, the internal atmosphere of the index chamber 130 may be maintained in an atmospheric pressure atmosphere. As will be described later, the internal atmosphere of the transfer chamber 330 may be maintained in the vacuum pressure atmosphere. The load lock chamber 310 may be disposed between the index chamber 130 and the transfer chamber 330, and an internal atmosphere thereof may be changed between an atmospheric pressure atmosphere and a vacuum pressure atmosphere.

Figure 16:
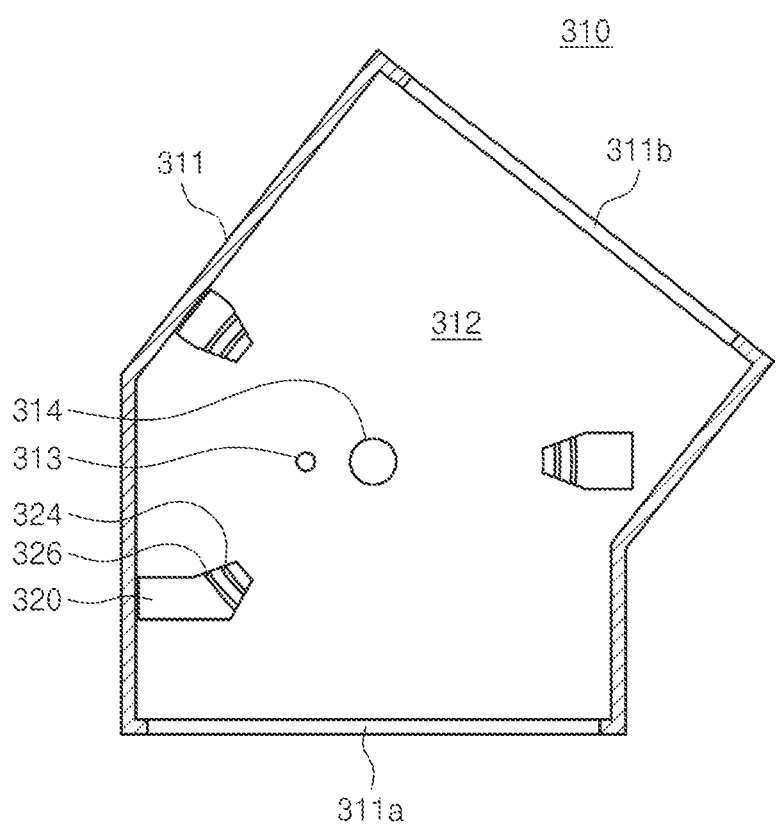
FIG. 16 is a plan cross-sectional view illustrating an appearance of a load lock chamber of FIG. 1.

FIG. 16 is a plan cross-sectional view illustrating an appearance of a load lock chamber of FIG. 1. Referring to FIG. 16, the load lock chamber 310 may include a housing 311 and the support shelves 320.

The housing 311 may have an interior space 312. The housing 311 may have the interior space 312, in which the substrate "W" or the ring member "R" is seated. The housing 311 may be disposed between the index chamber 130 and the transfer chamber 330, which have been described above. Furthermore, the housing 311 may have an opening. A plurality of openings may be provided in the housing 311. For example, a first opening 311a of the openings may be selectively communicated with the index chamber 130 by a gate valve (not illustrated). Furthermore, a second opening 311b of the openings may be selectively communicated with the transfer chamber 330 by the gate valve (not illustrated).

Furthermore, the housing 311 may have a vent hole 313, through which vent gas is supplied into the interior space 312 of the housing 311. Furthermore, the housing 311 may have a pressure-reducing hole that reduces a pressure in the interior space 312 of the housing 311. The vent gas may be an inert gas. For example, the vent gas may be a gas including nitrogen, argon, and the like. However, the present disclosure is not limited thereto, and the vent gas may be various known inert gases. Further, a pressure-reducing hole 314 may be connected to an pressure-reducing member (not illustrated). The pressure-reducing member may be a pump. However, the present disclosure is not limited thereto, and the pressure-reducing member may be variously modified to known apparatuses that reduce the pressure of the interior space 312. As the vent hole 313 and the pressure-reducing hole 314 are formed in the housing 311, a pressure of the interior space of the housing 311 may be freely changed between the atmospheric pressure and the vacuum pressure.

The support shelves 320 may be provided in the interior space 312. The support shelves 320 may support the substrate "W" or the ring member "R" in the interior space 312. Furthermore, a diameter of the ring member "R" may be larger than that of the substrate "W".

One or more support shelves 320 may be provided. For example, a plurality of support shelves 320 may be provided. Three support shelves 320 may be provided. The support shelves 320 may be provided to be spaced apart from each other when viewed from a top. When viewed from a top, the support shelves 320 may be disposed at locations that overlap the openings 32 formed in the above-described ring carrier 30. For example, when viewed from a top, the support shelves 320 may be disposed at locations that overlap the openings 32 formed in the ring carrier 30, a direction of which is aligned by the alignment unit 200. Furthermore, the support shelves 320 may have a substantially inverse "L" shape when viewed in a cross-section thereof.

Furthermore, the support shelf 320 may include a first pad 324 and a second pad 326. The first pad 324 and the second pad 326 may be formed of a material that has an anti-friction property against the substrate "W" or the ring member "R". For example, the first pad 324 and the second pad 326 may be formed of polyetheretherketone (PEEK) filled with carbon. However, the embodiment, in which the PEEK filled with carbon is used as the material of the first pad 324 and the second pad 326, is merely an example, and various modifications may be made with other known materials having similar properties.

Figure 17:
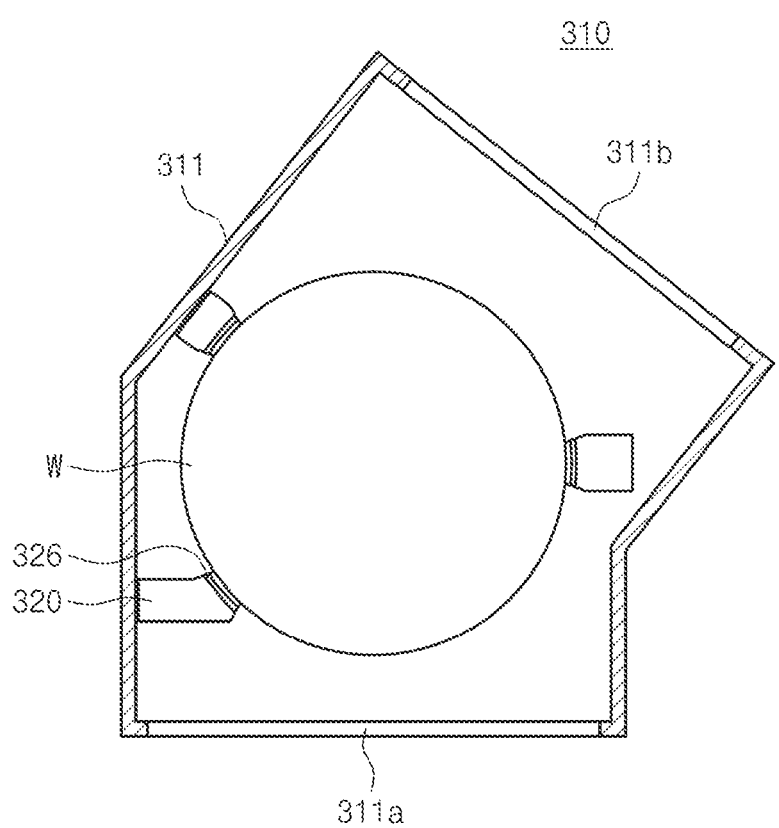
FIG. 17 is a view illustrating an appearance, in which a substrate is positioned on a support shelf of FIG. 16.

The first pad 324 may have a substantially arc shape when viewed from a top. The first pad 324 may be disposed closer to the pressure-reducing hole 314 than the second pad 326. The first pad 324 may be disposed on an inner side of an outer periphery of the substrate "W" when viewed from a top. That is, as illustrated in FIG. 17, the first pad 324 may support, among the substrate "W" and the ring member "R", the substrate "W".

The second pad 326 may have a substantially arc shape when viewed from a top. The second pad 326 may be disposed farther away from the pressure-reducing hole 314 than the first pad 324. When viewed from a top, the second pad 326 may be disposed on an outer side of the outer periphery of the substrate "W" and the inner periphery of the ring member "R", and may be disposed on an inner side of the outer periphery of the ring member "R". That is, the second pad 326 may support, among the substrate "W" and the ring member "R", the ring member "R".

Figure 18:
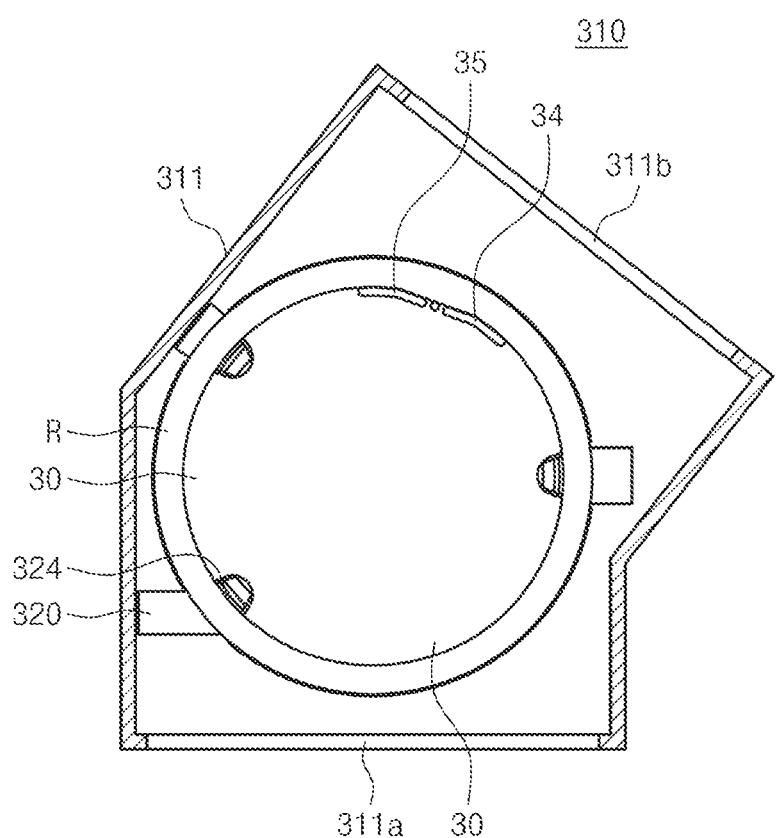
FIG. 18 is a view illustrating an appearance, in which a ring member is positioned on a support shelf of FIG. 16.
Figure 19:
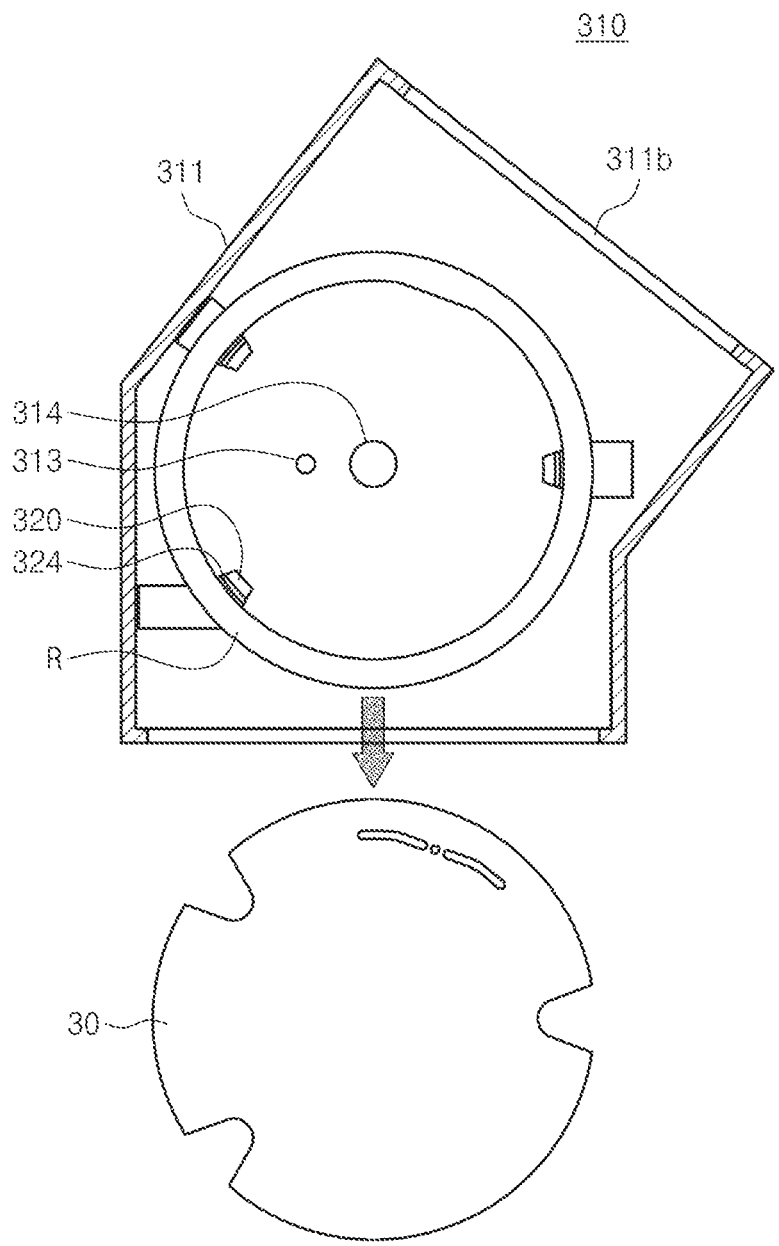
FIG. 19 is a view illustrating an appearance, in which a ring carrier of FIG. 18 is carried out from a load lock chamber.

Furthermore, when viewed from a top, the support shelves 320 may be disposed at locations that overlap the openings 32 formed in the above-described ring carrier 30. Accordingly, as illustrated in FIG. 18, when the first transfer hand 152 carries the ring carrier 30, on which the ring member "R" is positioned, into the load lock chamber 310 and the first transfer hand 152 is moved downwards, the ring member "R" is poisoned on the support shelves 320, and the ring carrier 30 may be moved downwards while being positioned on the first transfer hand 152. Thereafter, as illustrated in FIG. 19, when the first transfer hand 152 is retreated, the ring carrier 30 may be separated from the ring member "R" and be carried out from the load lock chamber 310.

Referring to FIG. 1 again, the transfer chamber 330 may be disposed between the load lock chamber 310 and the process chamber 370. The internal atmosphere of the transfer chamber 330 may be maintained in the vacuum pressure atmosphere. The second transfer robot 350 may be provided in the transfer chamber 330. The second transfer robot 350 may transfer the substrate "W" and the ring member "R"

between the load lock chamber 310 and the process chamber 370. Furthermore, the second transfer robot 350 may have a second transfer hand 352.

Figure 20:
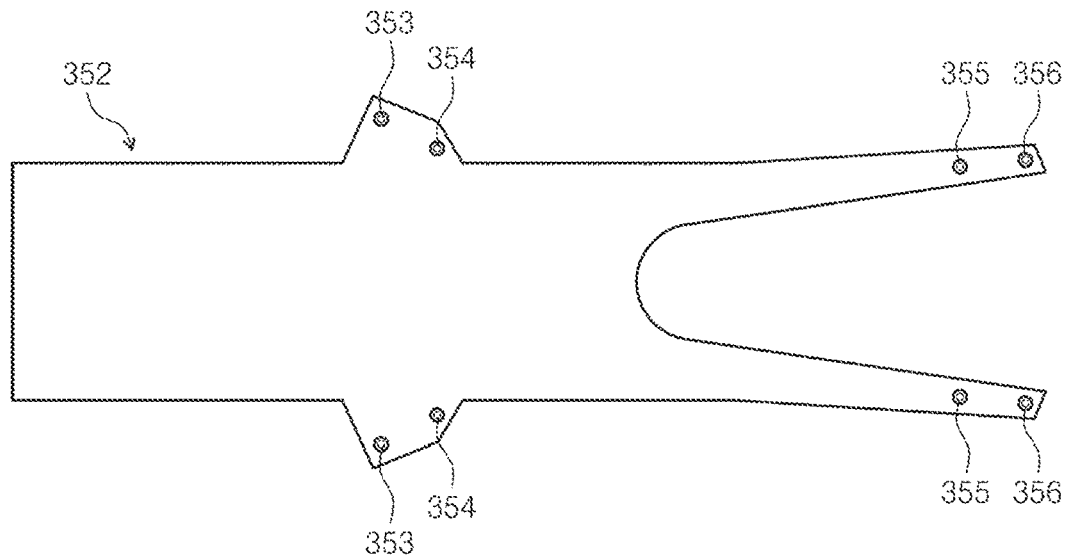
FIG. 20 is a view illustrating an appearance of a second transfer hand of FIG. 1.
Figure 21:
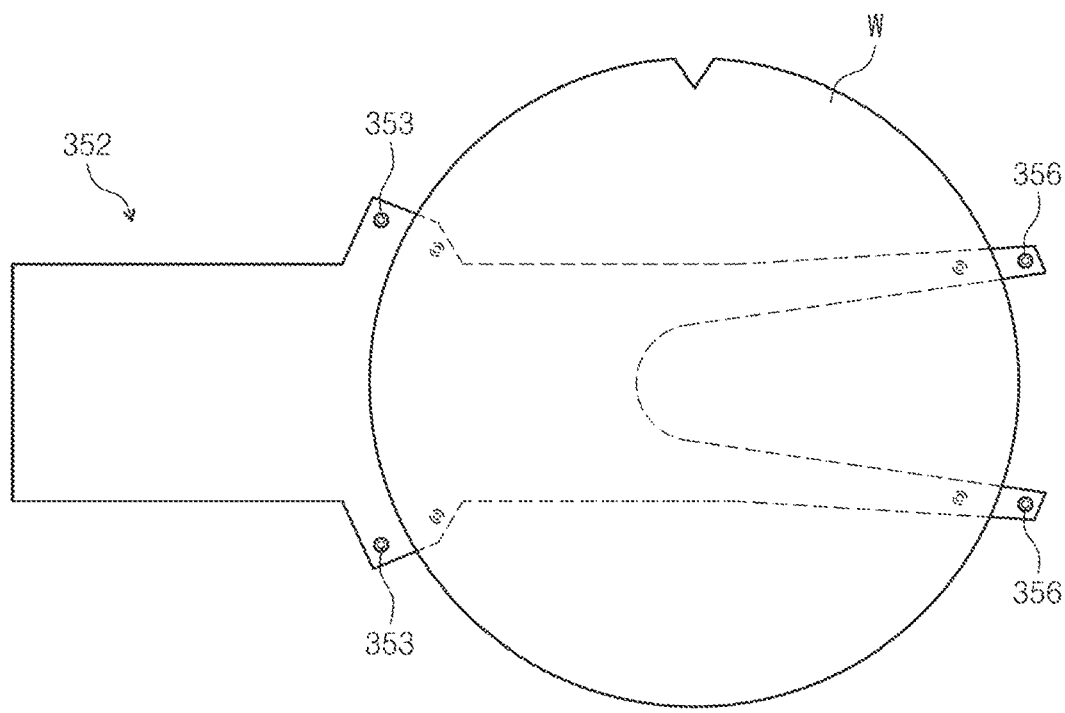
FIG. 21 is a view illustrating an appearance, in which a substrate is positioned on a second transfer hand of FIG. 20.
Figure 22:
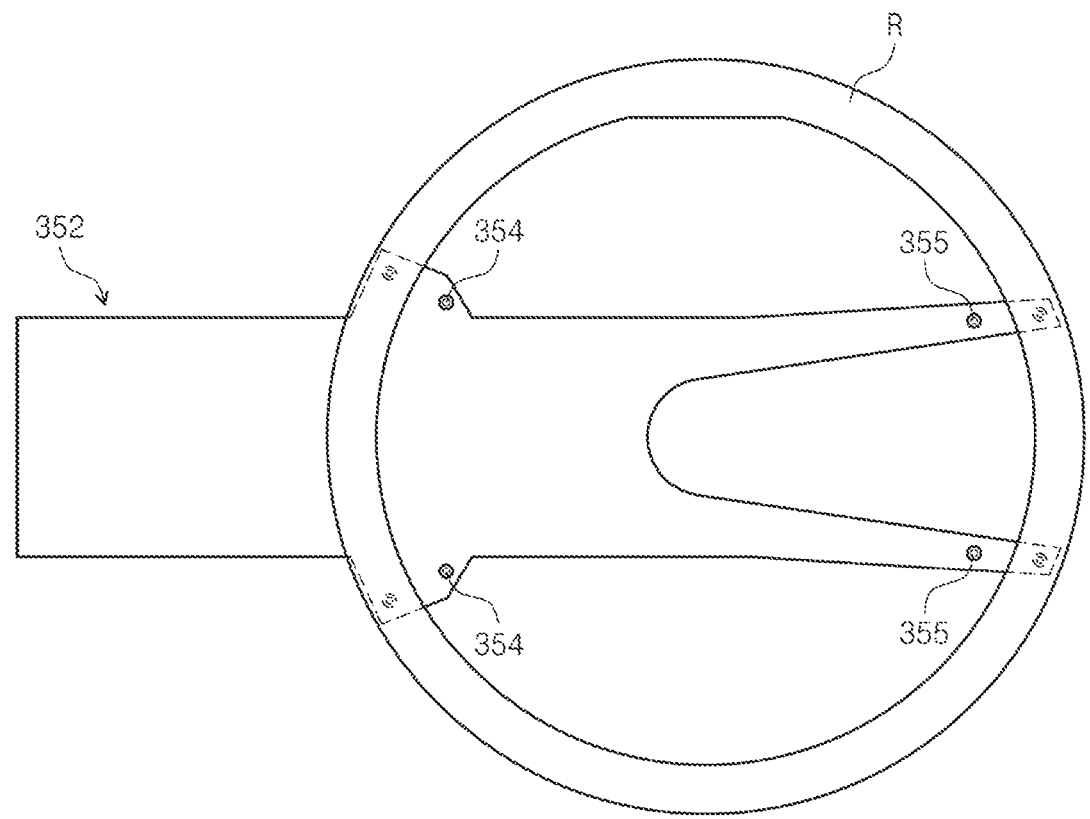
FIG. 22 is a view illustrating an appearance, in which a ring member is positioned on a second transfer hand of FIG. 20.

FIG. 20 is a view illustrating an appearance of a second transfer hand of FIG. 1. Referring to FIG. 20, the second transfer hand 352 of the second transfer robot 350 may have a size that is larger than that of the first transfer hand 152. A pair of first transfer pads 353, a pair of second transfer pads 354, a pair of third transfer pads 355, and a pair of fourth transfer pads 356 may be provided on the second transfer hand 352. The second transfer pad 354 and the third transfer pad 355 may be disposed between the first transfer pad 353 and the fourth transfer pad 356. The second transfer pad 354 and the third transfer pad 355 may be disposed on an inner side of an outer periphery of the substrate "W" when viewed from a top. That is, as illustrated in FIG. 21, the second transfer pad 354 and the third transfer pad 355 may support, among the substrate "W" and the ring member "R", the substrate "W". When viewed from a top, the first transfer pad 353 and the fourth transfer pad 356 may be disposed on an outer side of the outer periphery of the substrate "W" and the inner periphery of the ring member "R", and may be disposed on an inner side of the outer periphery of the ring member "R". That is, the second pad 326 may support, among the substrate "W" and the ring member "R", the ring member "R".

Referring to FIG. 1 again, one or more process chambers 370 may be connected to the transfer chamber 330. The process chamber 370 may be a chamber that performs a process on the substrate "W". The process chamber 370 may be a liquid treating chamber that treats the substrate "W" by supplying a treatment liquid to the substrate "W". Furthermore, the process chamber 370 may be a plasma chamber that treats the substrate "W" by using plasma. Furthermore, some of the process chambers 370 may be liquid treatment chambers that treat the substrate "W" by supplying a treatment liquid to the substrate "W", and some of the process chambers 370 may be plasma chambers that treat the substrate "W" by using plasma. However, the present disclosure is not limited thereto, and a substrate treating process performed in the process chamber 370 may be variously modified to known substrate treating processes. Furthermore, when the process chamber 370 is a plasma chamber that treats the substrate "W" by using the plasma, the plasma chamber may be a chamber that performs an etching or ashing process of removing a thin film on the substrate "W" by using the plasma. However, the present disclosure is not limited thereto, and a plasma treatment process performed in the process chamber 370 may be variously modified to known plasma treatment processes.

Figure 23:
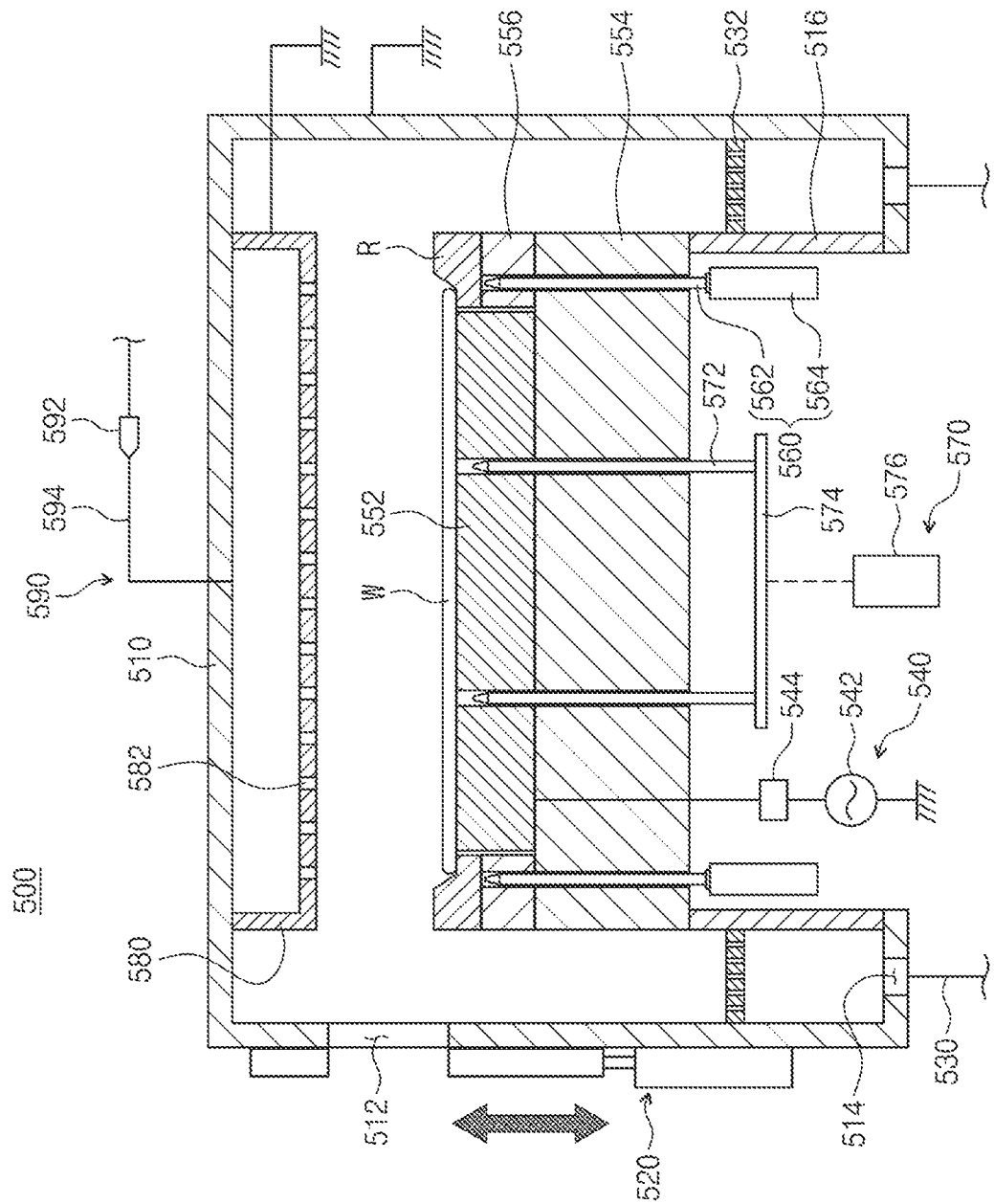
FIG. 23 is a view illustrating a substrate treating apparatus provided in a process chamber of FIG. 1.

FIG. 23 is a view illustrating a substrate treating apparatus provided in a process chamber of FIG. 1. Referring to FIG. 23, a substrate treating apparatus 500 provided in the process chamber 370 will be described in detail. The substrate treating apparatus 500 may treat the substrate "W" by transferring plasma to the substrate "W".

The substrate treating apparatus 500 may include a treatment container 510, a gate valve 520, an exhaust line 530, a power source unit 540, a support unit 550, a first lift pin module 560, a second lift pin module 570, a baffle plate 580, and a gas supply unit 590.

The treatment container 510 may have a treatment space. The treatment container 510 may be grounded. The treatment container 510 may provide the treatment space, in which the substrate "W" is treated. The treatment space of the treatment container 510 may be maintained substantially at a vacuum pressure atmosphere when the substrate "W" is treated. An entrance 512, through which the substrate "W" or the ring member "R" is carried in and out, may be formed on one side of the treatment container 510. The gate valve 520 may selectively open and close the entrance 512.

An exhaust hole 514 may be formed on a bottom surface of the treatment container 510. The exhaust line 530 may be connected to the exhaust hole 514. The exhaust line 530 may exhaust a process gas supplied to the treatment space of the treatment container 510, a process by-product, and the like to an outside of the treatment container 510 through the exhaust hole 514. Furthermore, an exhaust plate 532 that makes it possible to exhaust the treatment space more uniformly may be provided at an upper portion of the exhaust hole 514. The exhaust plate 532 may substantially have a ring shape when viewed from the top. Furthermore, at least one exhaust hole may be formed in the exhaust plate 532. The operator may select, among a plurality of exhaust plates 532 having various shapes and sizes, an exhaust plate 532 that may uniformly exhaust the treatment space and install the exhaust plate 532 at an upper portion of the exhaust hole 514.

Furthermore, the treatment container 510 may further include a support member 516. The support member 516 may support at least a portion of a base included in the support unit 550, which will be described below. For example, the support member 516 may be configured to support a lower portion of an insulation plate 554 included in the support unit 550.

The power source unit 540 may generate RF power that excites the process gas supplied by the gas supply unit 590, which will be described below, in a plasma state. The power source unit 540 may include a power supply 542 and a matcher 544. The power supply 542 and the matcher 544 may be installed on an electric power transmission line. Furthermore, the electric power transmission line may be connected to a chuck 552.

The support unit 550 may support the substrate "W" in the treatment space of the treatment container 510. The support unit 550 may include the chuck 552, an insulation plate 554, and a quartz ring 556.

The chuck 552 may have a support surface that supports the substrate "W". The chuck 552 may support the substrate "W", and may chuck the supported substrate "W". For example, an electrostatic plate (not illustrated) may be provided in the chuck 552, and the chuck 552 may be an electrostatic chuck that chucks the substrate "W" by using an electrostatic force. For example, the chuck 552 may be an electrode static chuck (ESC). However, the present disclosure is not limited thereto, and the chuck 552 may chuck the substrate "W" in a vacuum suction scheme.

The insulation plate 554 may have a circular shape when viewed from a top. The above-described chuck 552, and the quartz ring 556, which will be described below, may be positioned on the insulation plate 554. The insulation plate 554 may be a dielectric body. For example, the insulation plate 554 may be formed of a material including ceramics.

The quartz ring 556 may be formed of a material including quartz. The quartz ring 556 may substantially have a ring shape when viewed from the top. The quartz ring 556 may substantially have a shape that surrounds the chuck 552 when viewed from the top. The quartz ring 556 may have a shape that surrounds the substrate "W" supported by the chuck 552 when viewed from the top. Furthermore, the ring member "R" (for example, a focus ring) may be positioned on the upper surface of the inner side of the quartz ring 556.

When viewed from a top, the ring member "R" positioned on an upper surface of the quartz ring 556 may have a ring shape. The ring member "R" may have a shape, of which a height of an upper surface of an inner side is lower than a height of an upper surface of an outer side thereof. A lower surface of a peripheral area of the substrate "W" may be positioned on the upper surface of the inner side of the ring member "R". Furthermore, the ring member "R" may have an inclined surface that is inclined upwards in a direction that faces an outer side of the substrate "W" from a center of the substrate "W" between the upper surface of the inner side and the upper surface of the outer side thereof. Accordingly, even though a location of the substrate "W" is rather inaccurate when the substrate "W" is positioned on the upper surface of the inner side of the ring member "R", the substrate "W" may be properly positioned on the upper surface or the inner side of the ring member "R" while the substrate "W" is slid along the inclined surface of the ring member "R".

The first lift pin module 560 may elevate the ring member "R" positioned on the upper surface of the quartz ring 556. The first lift pin module 560 may include a first lift pin 562 and a first pin driving part 564. A plurality of first lift pins 562 may be provided, and a plurality of first pin driving parts 564 that move the first lift pins 562 upwards and downwards may be provided. Furthermore, when viewed from a top, the first lift pins 562 may be disposed not to overlap the chuck 552. The lift pin 562 may be moved upwards and downwards along the pin holes formed in the insulation plate 554 and/or the quartz ring 556. Furthermore, the pin driving part 564 may be a cylinder that uses a pneumatic pressure or a hydraulic pressure, or a motor.

The second lift pin module 570 may elevate the substrate "W". The second lift pin module 570 may include a second lift pin 572, an elevation plate 574, and a second pin driving part 576. The second lift pin 572 may be coupled to the elevation plate 574. The elevation plate 574 may be moved upwards and downwards by the second pin driving part 576.

The baffle plate 580 may be provided at an upper portion of the support unit 550. The baffle plate 580 may be formed of an electrode material. At least one baffle hole 582 may be formed in the baffle plate 580. For example, a plurality of baffle holes 582 may be formed, and may be uniformly formed in a whole area of the baffle plate 580 when viewed from the top. The baffle plate 580 makes it possible to uniformly deliver the process gas supplied by the gas supply unit 590, which will be described below, to the substrate "W".

The gas supply unit 590 may supply the process gas into the treatment space of the treatment container 510. The process gas may be a gas that is excited into a plasma state by the power source unit 540, which will be described below. The gas supply unit 590 may include a gas supply source 592 and a gas supply line 594. One end of the gas supply line 594 may be connected to the gas supply source 592, and an opposite end of the gas supply line 594 may be connected to an upper portion of the treatment container 510. Accordingly, the process gas delivered by the gas supply source 592 may be supplied to an upper area of the baffle plate 580 through the gas supply line 594. The process gas supplied to the upper area of the baffle plate 580 may be introduced into the treatment space of the treatment container 510 through the baffle hole 582.

Referring to FIG. 1 again, the controller 700 may control the substrate treating apparatus 10. The controller 700 may control the index part 100 and the process executing unit 300. The controller 700 may control the first transfer robot 150 and the second transfer robot 350. The controller 700 may control the substrate treating apparatus 500 provided in the process chamber 370 such that the substrate "W" may be treated in the process chamber 370 by using the plasma. Furthermore, the controller 700 may control configurations of the substrate treating apparatus 10 such that a transfer method for transferring the ring member "R", which will be described below, may be performed by the substrate treating apparatus 10.

Furthermore, the controller 700 may include a process controller including a microprocessor (computer) that executes control of the substrate treating apparatus 10, a keyboard for inputting commands to allow an operator to manage the substrate treating apparatus 10, a user interface including a display that visualizes and displays an operation situation of the substrate treating apparatus 10, and a memory unit for storing a control program for executing processing executed by the substrate treating apparatus 10 under a control of the process controller, or a program for executing processing, that is, a processing recipe in elements according to various data and processing conditions. Furthermore, the user interface and the memory unit may be connected to the process controller. The processing recipe may be stored in a memory medium of the memory unit, and the memory medium may be a hard disk, and may be a transportable disk such as a CD-ROM, a DVD, or the like, a semiconductor memory such as a flash memory.

Hereinafter, the method for transferring the ring member "R" according to an embodiment of the present disclosure will be described. In detail, a transfer sequence of transferring the ring member "R" that is unused to the process chamber 370 will be described.

When an exchange period of the ring member "R" mounted on the process chamber 370 is reached, the OHT apparatus may transfer the second container 22 to the load port 110. When the second container 22 is transferred to the load port 110, the first transfer robot 150 may carry the ring carrier 30 received in the second container 22 out of the second container 22 by using the first transfer hand 152. Then, a direction of the ring carrier 30 may be received in the second container 22 while being aligned. When it is necessary to align the direction of the ring carrier 30, the first transfer robot 150 may transfer the ring carrier 30 to the alignment chamber 170, and the alignment unit 200 may align the ring carrier 30 in a state, in which the ring member "R" is not positioned thereon.

Thereafter, the first transfer hand 152 may enter the second container 22 in a state, in which it supports the ring carrier 30. When the first hand 152 completely enters the second container 22, the first transfer hand 152 may move upwards to position the unused ring member "R" received in the second container 22 on the ring carrier 30. Then, the ring member "R" may be in a state, in which the direction thereof is aligned by the alignment pin 22b in the second container. Accordingly, the ring member "R" may be positioned on the ring carrier 30 in a state, in which the direction thereof is aligned.

When the ring member "R" is positioned on the ring carrier 30, the ring carrier 30 may be transferred to the alignment chamber 170, and the direction thereof may be aligned by the alignment unit 200. After the direction of the ring carrier 30 in a state, in which the ring member "R" is positioned, is aligned by the alignment unit 200, the first transfer robot 150 may transfer the ring carrier 30 in a state, in which the ring member "R" is positioned thereon, to the load lock chamber 310.

When the first transfer hand 152 completely enters the load lock chamber 310, the first transfer hand 152 may be moved downwards. Accordingly, the ring member "R" on the ring carrier 30 may be seated on the support shelves 320, and the ring carrier 30 may be separated from the ring member "R". When the ring carrier 30 is separated from the ring member "R", it may be carried out from the load lock chamber 310. The ring member "R" seated on the support shelves 320 of the load lock chamber 310 may be carried out by the second transfer hand 352 of the second transfer robot 350 and be transferred into the process chamber 370.

The ring member "R" used in the process chamber 370 is carried out in a reverse sequence to the above-described carry-in sequence of the unused ring member "R", a repeated description thereof will be omitted.

Figure 24:
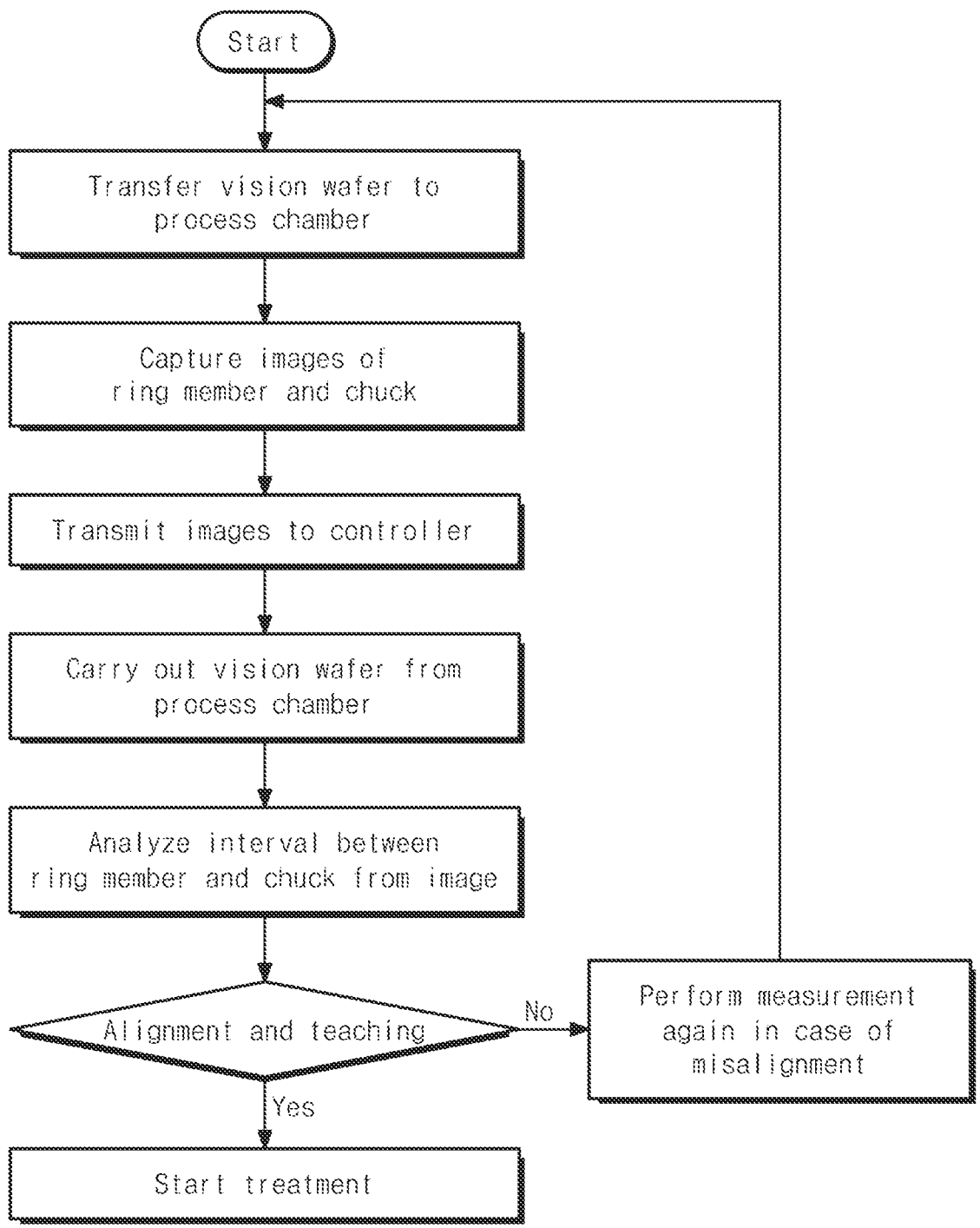
FIG. 24 is a flowchart illustrating a sequence of aligning a location of a ring member according to an embodiment of the present disclosure.

Hereinafter, a sequence of aligning the ring member "R" according to an embodiment of the present disclosure will be described. FIG. 24 is a flowchart illustrating a sequence of aligning a location of a ring member according to an embodiment of the present disclosure. As described above, when the ring member "R" has completely transferred into the process chamber 370, the substrate type sensor (for example, a vision wafer VW having an image acquiring module, such as a camera) received in a third container 23 that is any one of the containers 20 may be transferred into the process chamber. The third container 23 may be transferred to the load port 110 by an overhead transport (OHT) apparatus.

Figure 25:
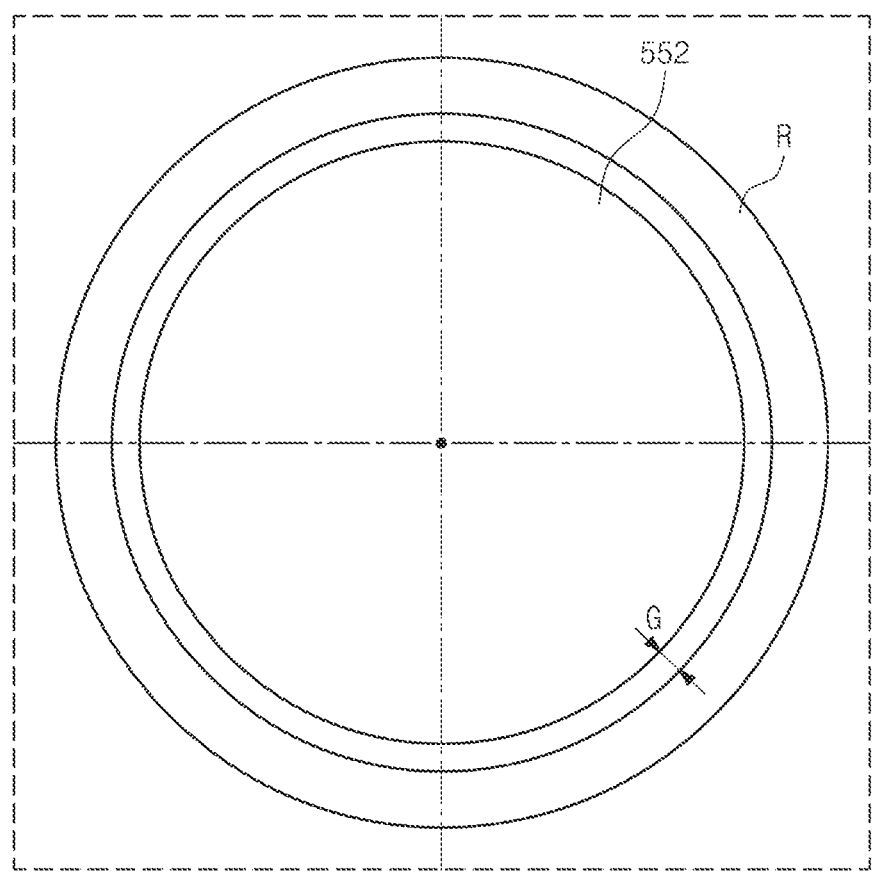
FIGS. 25 and 26 are views illustrating an appearance, in which a center location of a ring member is detected through an image acquired by a substrate type sensor.
Figure 26:
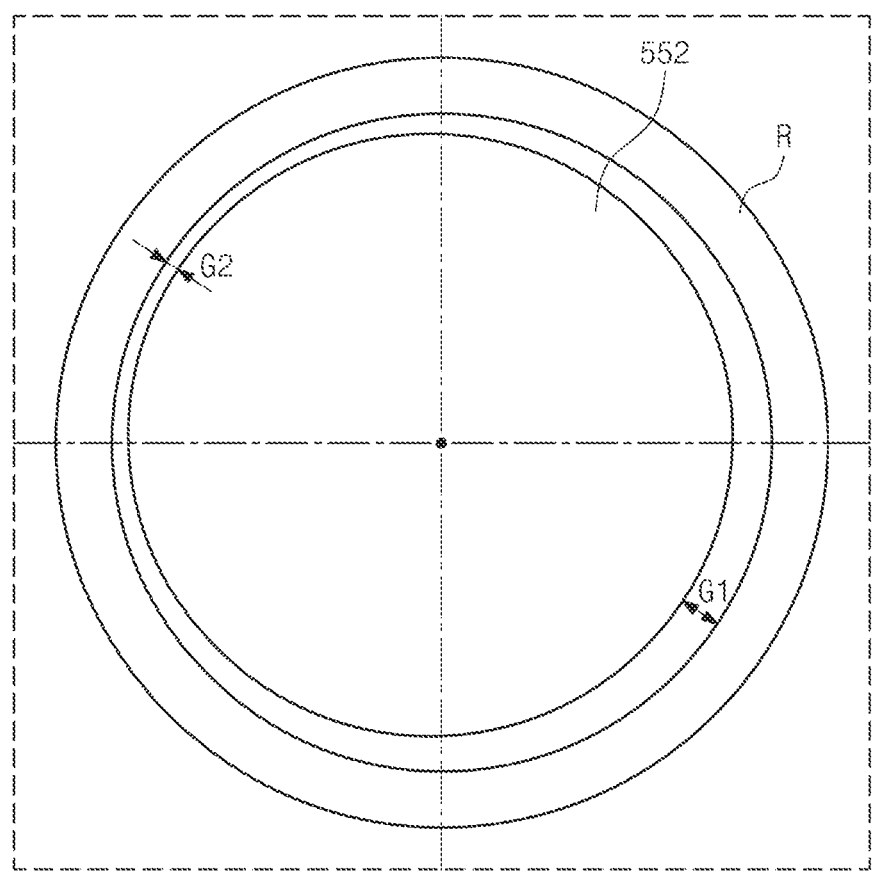

When the substrate type sensor VW is transferred into the process chamber 370, the substrate type sensor VW may capture an image including the ring member "R" and the chuck 552 provided in the process chamber 370. The captured image may be delivered to the controller 700. When the image is transferred to the controller 700, the substrate type sensor VW may be carried out of the process chamber 370. Thereafter, the controller 700 may measure an interval between the ring member "R" and the chuck 552 from the image received from the substrate type sensor VW. For example, as illustrated in FIG. 25, when the interval "G" between the ring member "R" and the chuck 552 is constant, the controller 700 determines that the ring member "R" has been transferred to a preset location. In this case, the substrate "W" starts to be treated in the process chamber 370. Unlike this, as illustrated in FIG. 26, when the interval between the ring member "R" and the chuck 552 includes a first interval G1 and a second interval G2 that is different from the first interval G1, it may be determined that the ring member "R" is not properly transferred to the preset location, and the second transfer robot 350 may perform alignment (centering) of the ring member "R" again. If necessary, based on a distortion value derived through the first internal G1 and the second interval G2, transfer operations of the first transfer robot 150 and the second transfer robot 350 may be taught. When the alignment is properly performed, the substrate "W" starts to be treated in the process chamber 370. Unlike this, when the alignment is not properly performed, the substrate type sensor VW may be transferred to the process chamber 370 again. Thereafter, through the image acquired by the substrate type sensor VW again, the controller 700 may determine whether the location of the ring member "R" is a preset location. When the location of the ring member "R" deviates from a preset range, the controller 700 may generate an alarm such that an operator may recognize it.

Hereinafter, the container according to an embodiment of the present disclosure, which may charge the substrate type sensor VW, will be described. The container 20 that may charge the substrate type sensor VW, which will be described below, may be, among the containers 20, the third container 23 that receives the substrate type sensor VW.

Figure 27:
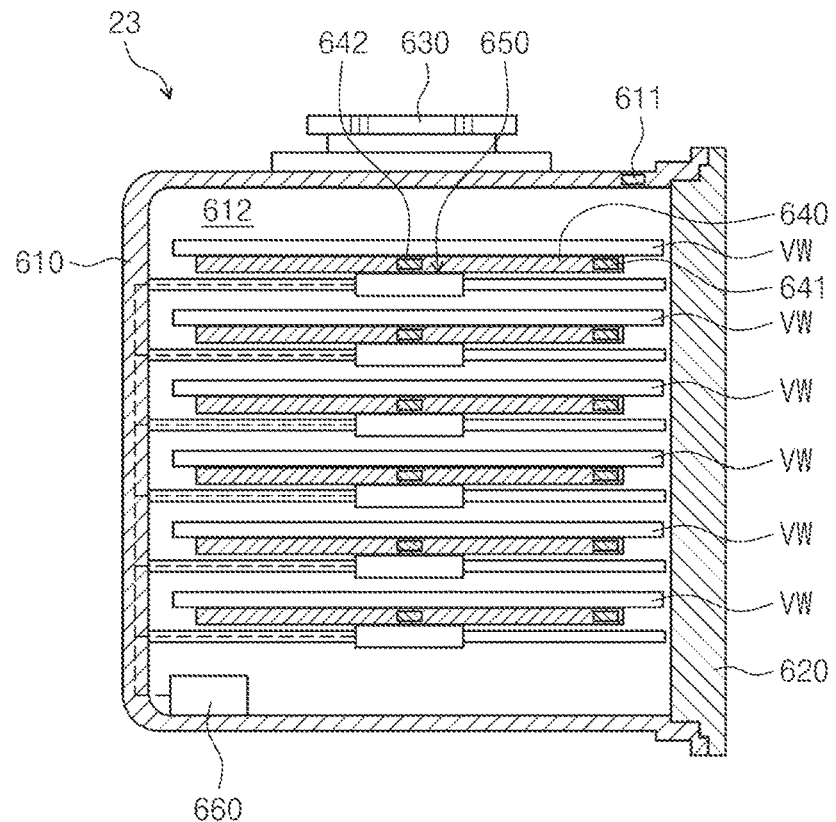
FIG. 27 is a cross-sectional view illustrating a third container of FIG. 1.
Figure 28:
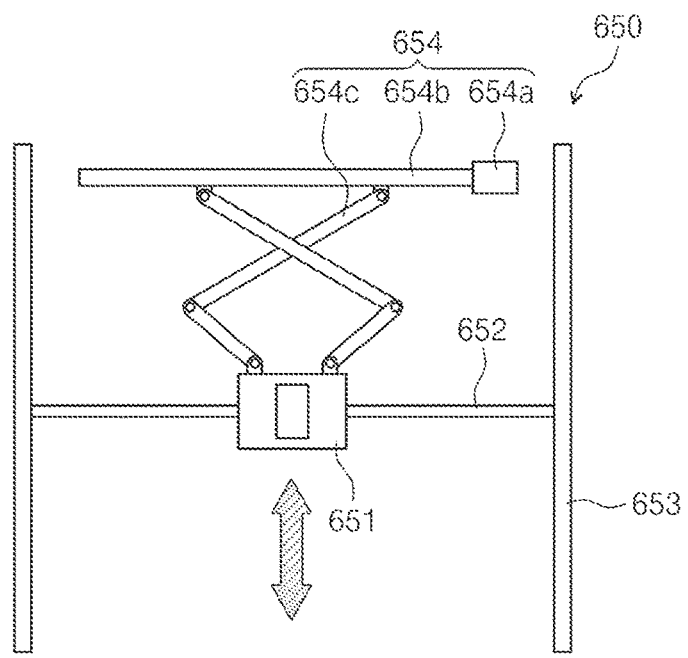
FIG. 28 is a view a charging module of FIG. 27, when viewed from a top.

FIG. 27 is a cross-sectional view illustrating the third container of FIG. 1. FIG. 28 is a view a charging module of FIG. 27, when viewed from a top. Referring to FIGS. 27 and 28, the third container 23 according to an embodiment of the present disclosure may receive the substrate type sensor VW. The third container 23 may receive the substrate type sensor VW, and may charge the received substrate type sensor VW.

The third container 23 may include a body 610, a door 620, a head 630, a shelf part 640, a charging module 650, and a battery part 660. By the head 630 installed on an upper side of the body 610, the third container 23 may be gripped by a transfer apparatus, such as the OHT apparatus. The body 610 may have a reception space 612, one side of which is opened. The body 610 may have a vessel shape, one side of which is opened. The above-described substrate type sensor VW may be received in the reception space 612 of the body 610. The reception space 612 of the body 610 may be opened and closed by the door 620 that selectively close one side of the body 610. Furthermore, an opening/closing sensor 611 that detects whether the reception space 612 is opened and closed by the door 620 may be provided in the body 610. The opening/closing sensor 611 may be a magnetic sensor that determines whether the door 620 and the body 610 contact each other by using magnetism.

However, the present disclosure is not limited thereto, and the opening/closing sensor 611 may include an irradiation part that irradiates light and a light receiving part that receives light. In this case, it may be detected whether the reception space 612 is opened or closed, according to whether the light irradiated by the irradiation part is received by the light receiving part. Furthermore, the kind of the opening/closing sensor 611 is not limited thereto, and it may be variously modified to known devices that may detect whether the door 620 is closed.

A plurality of shelf parts 640 may be provided in the reception space 612. Each of the shelf parts 640 forms a pair. For example, when the shelf parts 640 are viewed from a top, they may support one side and an opposite side of the substrate type sensor VW.

Furthermore, a first location sensor 641 that detects whether the substrate type sensor VW is positioned on the shelf parts 640 may be provided in the shelf parts 640. The first location sensor 641 may be a weight sensing sensor. Unlike this, the first location sensor 641 may be an optical sensor. Unlike this, the first location sensor 641 may be a distance sensing sensor. The kind of the first location sensor 641 is not limited thereto, and may be variously modified to known devices that may detect whether the substrate type sensor VW is positioned on the shelf parts 640.

Furthermore, a second location sensor 642 that may detect a location of a charging part 651 of the charging module 650 may be provided in the shelf parts 640. The second location sensor 642 may detect whether the charging part 651, which will be described below, is properly located at a charging location. The second location sensor 642 may be an optical sensor, a distance sensing sensor, or a magnetic sensor. The kind of the second location sensor 642 is not limited thereto, and may be variously modified to known devices that may detect the location of the charging part 651, which will be described below.

The charging module 650 may receive electric power from the battery part 660 (an example of the power source device), and may charge the substrate type sensor VW seated on the shelf parts 640. The charging module 650 may charge the substrate type sensor VW in a wireless charging scheme. A plurality of charging modules 650 may be provided. For example, the number of the charging modules 650 may be the same as the maximum number of the substrate type sensors VW that may be received in the reception space 612. The number of the charging modules 650 may be the same as the number of the plurality of shelf parts 640. That is, because the plurality of charging modules 650 are provided, the plurality of substrate type sensors VW may be charged at the same time.

Each of the charging modules 650 may include the charging part 651, a support part 652, a guide part 653, and a driving part 654. The charging part 651 is a part that directly delivers electric power to the power source device (for example, the battery) of the substrate type sensor VW. For example, the charging part 651 may have a wireless charging coil. The charging part 651 may charge the substrate type sensor VW in a wireless charging scheme, for example, in an electromagnetic induction scheme. When the charging part 651 charges the substrate type sensor VW in the electromagnetic induction scheme, the substrate type sensor VW may be charged rapidly, and the charging part 651 may become smaller due to the characteristics of the electromagnetic induction scheme, by which the standards of signal transmitting/receiving coils may be different.

The charging part 651 may be moved between a standby location (an example of a first location) and a charging location (an example of a second location) by the support part 652, the guide part 653, and the driving part 654. The standby location may be a location that is spaced far apart from one side of the body 610, which is opened and closed by the door 620. For example, when one side of the body 610 is a front side and a side corresponding to the one side of the body 610 is a rear side, the standby location may be a location that is closer to the rear side than to the front side of the body 610. When the charging part 651 is at the standby location, the first transfer hand 152 may not collide with the charging part 651 even when the first transfer hand 152 enters the reception space 612. The charging location may be a location that is closer to the front side of the body 610 than the standby location. The charging location may be a location that is suitable for charging the substrate type sensor VW. The charging location may be a location, at which the charging part 651 may initiate charging of the substrate type sensor VW.

The guide part 653 may be provided on, among the inner walls of the body 610, a side wall of the body 610. The guide part 653 may be a guide rail that may guide movement of the charging part 651 in one direction that is parallel to an upper surface or a lower surface of the substrate type sensor VW supported by the shelf parts 640. The support part 652 may be coupled to the charging part 651, and may have a bar shape, by which the support part 652 may be moved along the guide part 653. The driving part 654 may generate a driving force for moving the charging part 651 coupled to the support part 652 in one direction along the guide part 653.

The driving part 654 may include a driving source 654a, a driving transmitting source 654b, and an arm 654a. The driving source 654a may generate a driving force. The driving source 654a may be a motor. The arm 654a may receive the driving force from the driving source 654a. The arm 654a may be a pantograph. The arm 654a may have a structure that may be expanded and contracted. The arm 654a may be coupled to the charging part 651. The arm may receive the driving force generated by the driving transmitting source 654b by a medium of a driving transmitting source 654c. The driving transmitting source 654b may be a lead screw. The kind of the driving transmitting source 654c that transmits the driving force for generating the driving transmitting source 654b to the arm 654a is not limited to the lead screw, and may be variously modified to known devices that may transmit the driving force.

Figure 29:
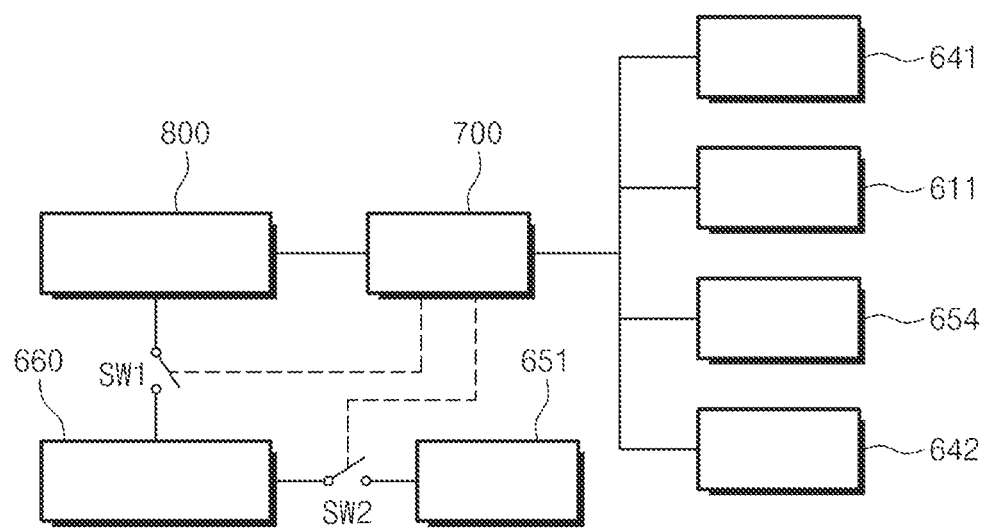
FIG. 29 is a conceptual view illustrating a substrate type sensor charging system according to an embodiment of the present disclosure.

FIG. 29 is a conceptual view illustrating a substrate type sensor charging system according to an embodiment of the present disclosure. Referring to FIG. 29, the battery part 660 installed in the third container 23 may be charged by a charging unit 800 provided in the load port 110. The controller 700 may control a first switch SW1 to selectively charge the battery part 660. The controller 700 may control an on/off operation of the first switch SW1 with reference to whether the third container 23 is properly seated in the load port 110. For example, when the third container 23 is properly seated in the load port 110, the charging unit 800 provided in the load port 110 may charge the battery part 660 installed in the third container 23 (so called, an FOUP charging mode). Electric energy stored in the battery part 660 may be delivered to the charging part 651.

Figure 30:
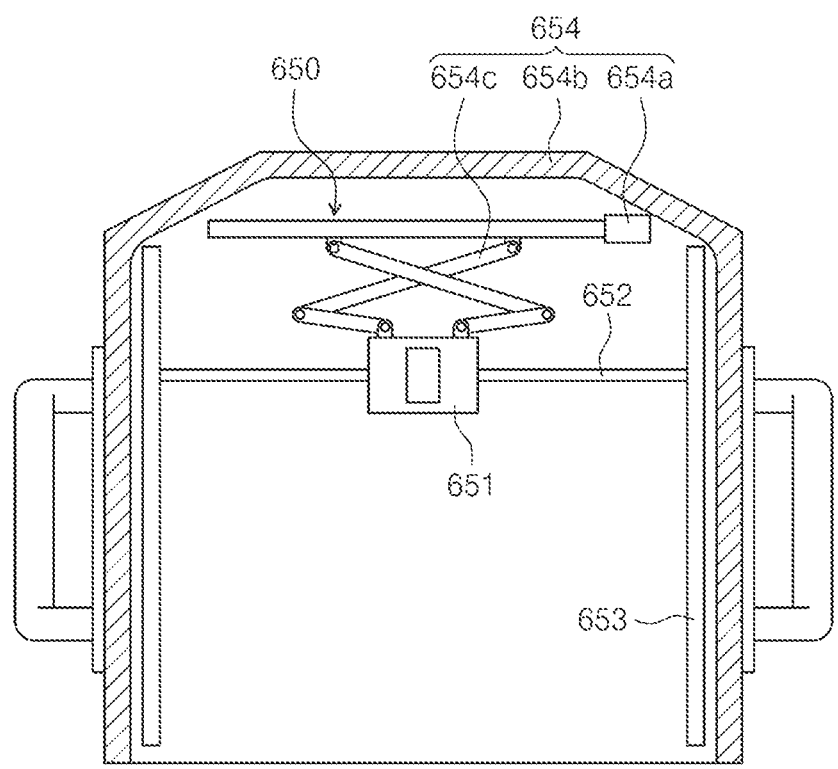
FIG. 30 is a view illustrating a charging module of FIG. 27 in a standby mode.
Figure 31:
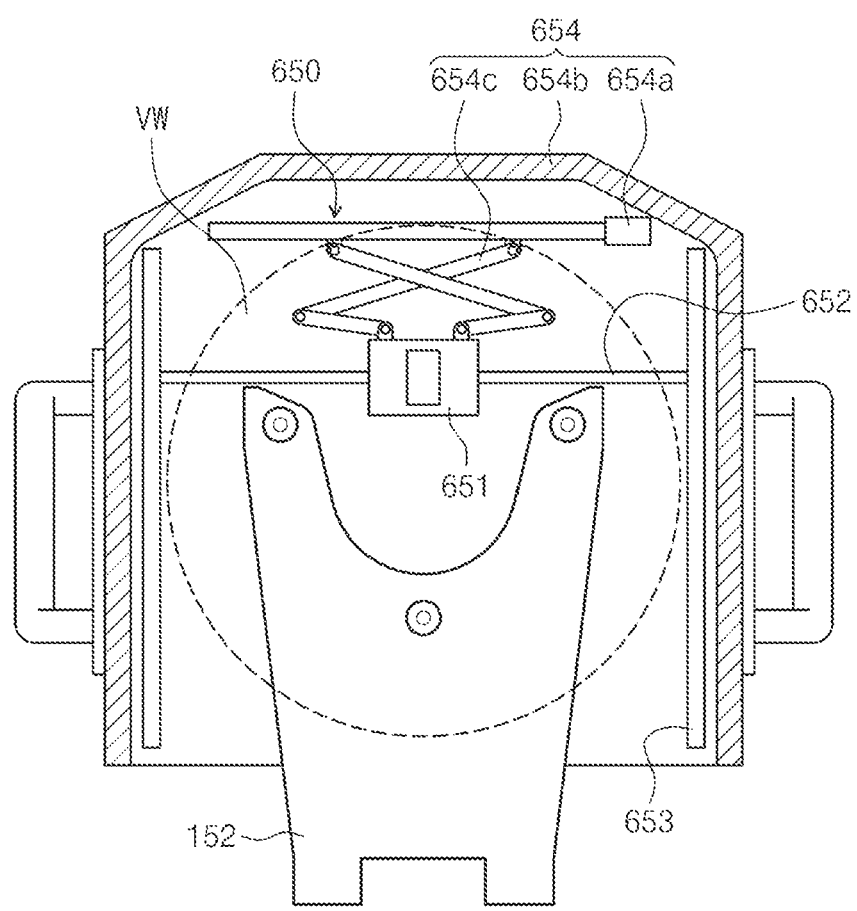
FIG. 31 is a view illustrating a state, in which a transfer hand enters a third container.

The charging module 650 may be controlled to a standby mode and a charging mode. The standby mode may be a mode, in which charging of the substrate type sensor VW is waited for. In the standby mode, the charging part 651 may be located at a standby location (see FIG. 30). For example, the standby mode may be initiated when the substrate type sensor VW has been completely charged for the opening/closing sensor detects that the reception space 612 is opened. Furthermore, when the reception space 612 is opened, the first transfer hand 152 may enter the reception space 612 (see FIG. 31), and then, because the charging part 651 is located at the standby location, collision thereof with the first transfer hand 152 may be minimized.

Figure 32:
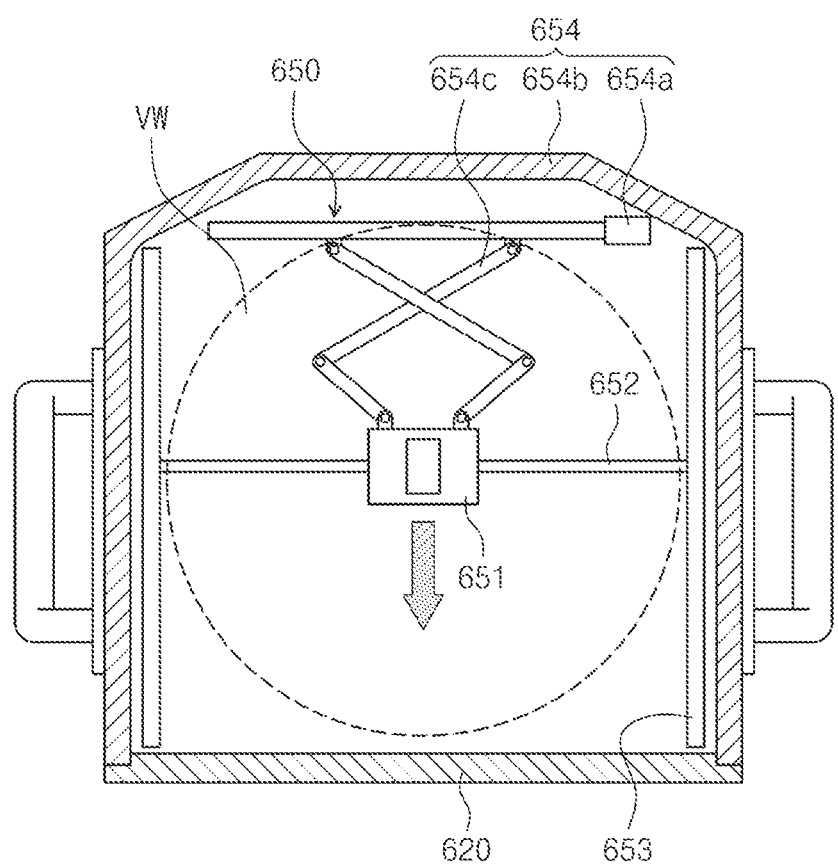
FIG. 32 is a view illustrating a charging module of FIG. 27 in a charging mode.

The charging mode may be a mode, in which charging of the substrate type sensor VW is performed. In the charging mode, the charging part 651 may be located at a charging location (see FIG. 32). The charging mode may be initiated when the first location sensor 641 detects that the substrate type sensor VW is seated on the shelf part 640 and the opening/closing sensor 611 detects that the reception space 612 is closed by the door 620. When the charging mode is initiated, a second switch SW2 installed between the battery part 660 and the charging part 651 may be switched on. When the charging mode is initiated, the driving source 654a may generate a driving force to move the charging part 641. When the second location sensor 642 detects that the charging part 651 has been completely moved to the charging location, the driving source 654a may stop generating the driving force and the charging part 651 may start charging.

In general, the substrate type sensor VW is charged outside the substrate treating apparatus 10, a plurality of transfer sequences are necessary to transfer the substrate type sensor VW to the process chamber 370. However, according to the embodiment of the present disclosure, because the substrate type sensor VW is charged in the third container 23 that may be positioned in the load port 110, a problem of requiring the plurality of transfer sequences, which have been described below, may be solved. In particular, when the substrate type sensor VW is charged in the third container 23, the charging part 651 and the first transfer hand 152 may collide with each other, and because the charging part 651 of the present disclosure may be moved between the standby location and the charging location, the above-described collision problem may be minimized. Furthermore, because the substrate type sensor VW is charged selectively according to the standby mode and the charging mode, unnecessary waste of the charging energy may be minimized.

According to an embodiment of the present disclosure, the ring member may be effectively transferred.

Furthermore, according to an embodiment of the present disclosure, the ring member may be transferred without changing the structure of the transfer hand.

Furthermore, according to an embodiment of the present disclosure, sliding and distortion of the ring member may be minimized when the ring member is transferred.

The effects of the present disclosure are not limited to the above-mentioned effects, and the unmentioned effects can be clearly understood by those skilled in the art to which the present disclosure pertains from the specification and the accompanying drawings.

The above detailed description exemplifies the present disclosure. Furthermore, the above-mentioned contents describe the exemplary embodiment of the present disclosure, and the present disclosure may be used in various other combinations, changes, and environments. That is, the present disclosure can be modified and corrected without departing from the scope of the present disclosure that is disclosed in the specification, the equivalent scope to the written disclosures, and/or the technical or knowledge range of those skilled in the art. The written embodiment describes the best state for implementing the technical spirit of the present disclosure, and various changes required in the detailed application fields and purposes of the present disclosure can be made. Accordingly, the detailed description of the present disclosure is not intended to restrict the present invention in the disclosed embodiment state. Furthermore, it should be construed that the attached claims include other embodiments.

What is claimed is:

1. A container that receives a substrate type sensor, the container comprising:
   a body having a reception space;
   a door configured to selectively open and close the reception space;
   a shelf part configured to support the substrate type sensor in the reception space;
   a charging module configured to charge the substrate type sensor supported by the shelf part and including a charging part disposed within the reception space and configured to move between a standby location and a charging location that charges the substrate type sensor,
   wherein the standby location and the charging location are within the reception space.

2. The container of claim 1, wherein the charging module includes:
   a guide part configured to guide movement of the charging part in one direction that is parallel to one surface of the substrate type sensor supported by the shelf part;
   a support part configured to support the charging part while moving along the guide part; and
   a driving part configured to move the support part in the one direction.

3. The container of claim 2, wherein the driving part includes:
   a driving source configured to generate a driving force; and
   an arm coupled to the charging part and configured to move the charging part in the one direction by using the driving force.

4. The container of claim 1, wherein the charging part is configured to move in an area on a lower side of the substrate type sensor supported by the shelf part.

5. The container of claim 1, wherein a plurality of shelf parts and a plurality of charging modules are provided, and
   wherein the charging modules are configured to charge substrate type sensors supported by the shelf parts, respectively.

6. The container of claim 1, further comprising:
   a first location sensor configured to detect whether the substrate type sensor is seated on the shelf part;
   a second location sensor configured to detect a location of the charging part; and
   an opening/closing sensor configured to detect whether the reception space is opened or closed.

7. The container of claim 6, wherein the charging part moves to the charging location when the first location sensor detects that the substrate type sensor is seated on the shelf part and the opening/closing sensor detects the reception space is closed by the door.

8. The container of claim 7, wherein the charging part starts to charge the substrate type sensor when the second location sensor detects that the charging part has completely moved to the charging location.

9. The container of claim 6, wherein the charging part moves to the standby location when it is detected that the substrate type sensor has been completely charged or when the opening/closing sensor detects that the reception space is opened.

10. A substrate treating system comprising:
    an index part having a load port;
    a process executing part configured to receive a substrate from the index part and treat the substrate; and
    a container positioned in the load port, and configured to receive a substrate type sensor carried into the process executing part,
    wherein the container further includes:
      a body having a reception space, one side of which is opened;
      a door configured to selectively open and close the reception space;
      a shelf part configured to support the substrate type sensor in the reception space;
      a charging module configured to charge the substrate type sensor supported by the shelf part and including a charging part disposed within the reception space and configured to move between a first location and a second location that is closer to the one side than the first location,
      wherein the first location and the second location are within the reception space.

11. The substrate treating system of claim 10, wherein the container further includes:
    a first location sensor configured to detect whether the substrate type sensor is seated on the shelf part;
    a second location sensor configured to detect a location of the charging part; and
    an opening/closing sensor configured to detect whether the reception space is opened or closed.

12. The substrate treating system of claim 11, further comprising:
    a controller configured to control the charging module based on a detection value detected by the first location sensor, the second location sensor, or the opening/closing sensor.

13. The substrate treating system of claim 12, wherein the controller is configured to control the charging module such that the charging module is in a charging mode for charging the substrate type sensor supported by the shelf part or in a standby mode, in which the charging part is located at the second location, based on the detection value.

14. The substrate treating system of claim 13, wherein the controller is configured to:
control the charging module such that the charging module is in the charging mode when the first location sensor detects that the substrate type sensor is seated on the shelf part and the opening/closing sensor detects that the reception space is closed by the door.

15. The substrate treating system of claim 13, wherein the controller is configured to control the charging module such that the charging module is in the standby mode when the substrate type sensor has been completely charged, when the first location sensor detects that the substrate is not positioned on the shelf part, or when the opening/closing sensor detects that the reception space is opened.

16. The substrate treating system of claim 10, wherein the charging module further includes:
a guide part configured to guide movement of the charging part in one direction that is parallel to one surface of the substrate type sensor supported by the shelf part;
a support part configured to support the charging part while moving along the guide part; and
a driving part configured to move the support part in the one direction.

17. The substrate treating system of claim 16, wherein the driving part includes:
a driving source configured to generate a driving force; and
an arm coupled to the charging part and configured to move the charging part in the one direction by using the driving force.

18. A substrate treating system comprising:
an index part having a transfer robot and a load port;
a process executing part configured to receive a substrate from the index part and treat the substrate; and
a container positioned in the load port, and configured to receive a substrate type sensor carried into the process executing part,
wherein the container includes:
a body having a reception space, one side of which is opened;
a door configured to selectively open and close the reception space;
a shelf part configured to support the substrate type sensor in the reception space; and
a charging module configured to charge the substrate type sensor supported by the shelf part in a wireless charging scheme, and
wherein the charging module includes:
a charging part configured to move between a standby location and a charging location that is closer to the one side than the standby location, and configured to move in an area on a lower side of the substrate type sensor supported by the shelf part;
a first location sensor configured to detect whether the substrate type sensor is seated on the shelf part;
a second location sensor configured to detect a location of the charging part; and
an opening/closing sensor configured to detect whether the reception space is opened or closed.

19. The substrate treating system of claim 18, wherein the charging module further includes:
a guide part configured to guide movement of the charging part in one direction that is parallel to one surface of the substrate type sensor supported by the shelf part;
a support part configured to support the charging part while moving along the guide part; and
a driving part configured to move the support part in the one direction, wherein the driving part further includes:
a driving source configured to generate a driving force; and
an arm coupled to the charging part and configured to move the charging part in the one direction by using the driving force.

20. The substrate treating system of claim 18, further comprising:
a controller,
wherein the controller is configured to:
generate a control signal for moving the charging part to the charging location when the first location sensor detects that the substrate type sensor is seated on the shelf part and the opening/closing sensor detects the reception space is closed by the door;
generate a control signal for causing the charging part to start to charge the substrate type sensor when the second location sensor detects that the charging part has completely moved to the charging location; and
generate a control signal for moving the charging part to the standby location when it is detected that the substrate type sensor has been completely charged or when the opening/closing sensor detects that the reception space is opened.

* * * * *